US009894818B2

(12) United States Patent
Song et al.

(10) Patent No.: US 9,894,818 B2
(45) Date of Patent: Feb. 13, 2018

(54) TRAY FEEDER AND PART PROVIDING METHOD USING THE SAME

(75) Inventors: Jun Keun Song, Seongnam-si (KR); Tae Young Lee, Seongnam-si (KR)

(73) Assignee: Hanwha Techwin Co., Ltd., Changwon-si (KR)

( * ) Notice: Subject to any disclaimer, the term of this patent is extended or adjusted under 35 U.S.C. 154(b) by 1418 days.

(21) Appl. No.: 13/542,277

(22) Filed: Jul. 5, 2012

(65) Prior Publication Data

US 2013/0045066 A1 Feb. 21, 2013

(30) Foreign Application Priority Data

Aug. 19, 2011 (KR) .................. 10-2011-0082969

(51) Int. Cl.
*H05K 13/02* (2006.01)
*H05K 13/04* (2006.01)

(52) U.S. Cl.
CPC ....... *H05K 13/021* (2013.01); *H05K 13/0434* (2013.01)

(58) Field of Classification Search
CPC ...... B65G 65/40; B65G 65/30; B65G 65/425; B65G 65/365; H01L 21/67778; H05K 13/0434; H05K 13/021; H05K 13/02; H05K 13/04; H05K 13/0404; H05K 13/0084; H05K 13/0069; H05K 13/0061
See application file for complete search history.

(56) References Cited

U.S. PATENT DOCUMENTS 4,697,974 A * 10/1987 Eltoukhy .......... H01L 21/67173
118/500
5,393,181 A * 2/1995 Perego ................ 414/416.05
(Continued)

FOREIGN PATENT DOCUMENTS

CN  1464312 A  12/2003
CN  1756475 A  4/2006
(Continued)

OTHER PUBLICATIONS

Communication dated Dec. 22, 2014, issued by the State Intellectual Property Office of P.R. China in counterpart Chinese Application No. 201210290878.4.
(Continued)

*Primary Examiner* — Glenn F Myers
(74) *Attorney, Agent, or Firm* — Sughrue Mion, PLLC

(57) ABSTRACT

Provided are a tray feeder which provides parts to a part mounting device and parts providing method using the same. The tray feeder includes: a magazine which houses at least one tray for accommodating parts; an inserting/extracting member which inserts a tray into the magazine or extracts a tray from the magazine; a buffer member which is positioned above the magazine and supports a standby tray from which parts accommodated therein are to be mounted on a board by a part mounting device; and a feeding member which is positioned above the inserting/extracting member and provides a tray supported by the feeding member so that parts accommodated in the supported tray are adhered by the part mounting device, wherein the inserting/extracting member is elevated or lowered to insert a tray into the magazine or extract a tray from the magazine.

9 Claims, 22 Drawing Sheets

(56) References Cited

U.S. PATENT DOCUMENTS

| | | | |
|---|---|---|---|
| 5,588,797 A * | 12/1996 | Smith | 414/797.5 |
| 5,727,311 A * | 3/1998 | Ida | H05K 13/021 29/740 |
| 5,942,012 A * | 8/1999 | Kumasaka et al. | 29/25.01 |
| 6,266,873 B1 * | 7/2001 | Kitamura | H05K 13/0408 29/739 |
| 6,370,765 B1 * | 4/2002 | Hiramoto | H05K 13/021 29/740 |
| 6,406,246 B1 * | 6/2002 | Itoh | G01R 31/01 324/756.02 |
| 6,524,052 B1 * | 2/2003 | Yamauchi | H05K 13/021 414/222.01 |
| 6,688,454 B2 * | 2/2004 | Cho | H05K 13/02 198/347.1 |
| 6,999,184 B2 * | 2/2006 | Yakiyama | H01L 21/67144 29/740 |
| 7,471,077 B2 * | 12/2008 | Shimada et al. | 324/756.07 |
| 8,311,664 B2 * | 11/2012 | Ohno | H05K 13/0434 414/277 |
| 8,534,985 B2 * | 9/2013 | Xu et al. | 414/796.7 |
| 2002/0003995 A1 * | 1/2002 | Nakamura | B65G 47/901 414/416.01 |
| 2003/0085160 A1 * | 5/2003 | Shim | G01R 31/2887 209/573 |
| 2006/0054656 A1 * | 3/2006 | Narita et al. | 228/9 |
| 2007/0011869 A1 * | 1/2007 | Watanabe et al. | 29/739 |
| 2007/0227941 A1 * | 10/2007 | Narita | H01L 21/67271 206/710 |

FOREIGN PATENT DOCUMENTS

| | | |
|---|---|---|
| JP | 06336310 A * | 12/1994 |
| JP | 11-289191 A | 10/1999 |
| JP | 2000-307290 A | 11/2000 |
| JP | 2004-103670 A | 4/2004 |
| JP | 3518412 B2 | 4/2004 |
| KR | 10-2004-0000814 A | 1/2004 |
| KR | 10-2010-0111242 A | 10/2010 |

OTHER PUBLICATIONS

Communication dated Apr. 18, 2016 issued by the Korean Intellectual Property Office in counterpart Application No. 10-2011-0082969.

Communication dated Dec. 16, 2016, issued by the Korean Intellectual Property Office in corresponding Korean Application No. 10-2011-0082969.

* cited by examiner

TRAY FEEDER AND PART PROVIDING METHOD USING THE SAME

CROSS-REFERENCE TO RELATED APPLICATION

This application claims priority from Korean Patent Application No. 10-2011-0082969 filed on Aug. 19, 2011 in the Korean Intellectual Property Office, the disclosure of which is incorporated herein in its entirety by reference.

BACKGROUND

1. Field

Apparatuses and methods consistent with exemplary embodiments relate to a tray feeder which provides parts to a part mounting device, and more particularly, to a tray feeder including a buffer member in which a pallet supporting trays is standing by.

2. Description of the Related Art

A tray feeder is a device which provides parts to be mounted on a board to a part mounting device, and includes a tray accommodating parts, a pallet supporting a tray, and a magazine housing the pallet. The pallet housed in the magazine is transferred to a feeder unit having an operating head of the part mounting device positioned therein using a transfer means, and the operating head adheres the parts accommodated in the tray to then be mounted on the board.

In one type of a tray feeder which transfers trays to a feeder unit while the magazine is elevated or lowered, the tray feeder may have an increased height when elevating or lowering the magazine. As a result, an operator's range of vision in an operating field may be narrowed. In addition, in a case where an operating failure, such as a part adhering error of the operating head, occurs, there may be a spatial limitation in the operator correcting the error in person.

In another type of a tray feeder which includes a transfer unit at a lateral side of a fixed magazine to carry a pallet housed in the magazine to a feeder unit, which is installed at a lateral side of the transfer unit, the tray feeder may be elongated in a lengthwise direction. As a result, the operating field space may be reduced and there may be a limitation in operator's movement, thereby lowering operating efficiency.

SUMMARY

One or more exemplary embodiments provide a tray feeder, which can enhance operating efficiency while efficiently using an operating field space, and a part providing method using the tray feeder.

The above and other objects will be described in or be apparent from the following description of the exemplary embodiments.

According to an aspect of an exemplary embodiment, there is provided a tray feeder which may include a magazine which houses at least one tray for accommodating parts; an inserting/extracting member which inserts a tray into the magazine or extracts a tray from the magazine; a buffer member which is positioned above the magazine and supports a standby tray from which parts accommodated therein are to be mounted on a board by a part mounting device; and a feeding member which is positioned above the inserting/extracting member and provides a tray supported by the feeding member so that parts accommodated in the supported tray are adhered by the part mounting device, wherein the inserting/extracting member is elevated or lowered to insert a tray into the magazine or extract a tray from the magazine.

According to an aspect of another exemplary embodiment, there is provided a part providing method using a tray feeder comprising a magazine, a buffer member, a feeding member, and an inserting/extracting member. The method may include: controlling a standby tray accommodating parts to be mounted on a board to stand by in the buffer member; inserting a mounted tray of which parts have been mounted on the board from the feeding member into the buffer member; inserting the standby tray from the buffer member into the feeding member; and housing the mounted tray inserted into the buffer member in the magazine positioned under the buffer member while elevating or lowering the inserting/extracting member positioned under the feeding member.

As described above, in the tray feeder according to exemplary embodiments and the part providing method using the tray feeder, operating efficiency can be enhanced while efficiently using an operating field space.

BRIEF DESCRIPTION OF THE DRAWINGS

The above and other aspects will become more apparent by describing in detail the exemplary embodiments thereof with reference to the attached drawings, in which.

DETAILED DESCRIPTION OF THE EXEMPLARY EMBODIMENTS

The inventive concept will now be described more fully hereinafter with reference to the accompanying drawings, in which exemplary embodiments are shown. This inventive concept may, however, be embodied in different forms and should not be construed as limited to the exemplary embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Figure 1:
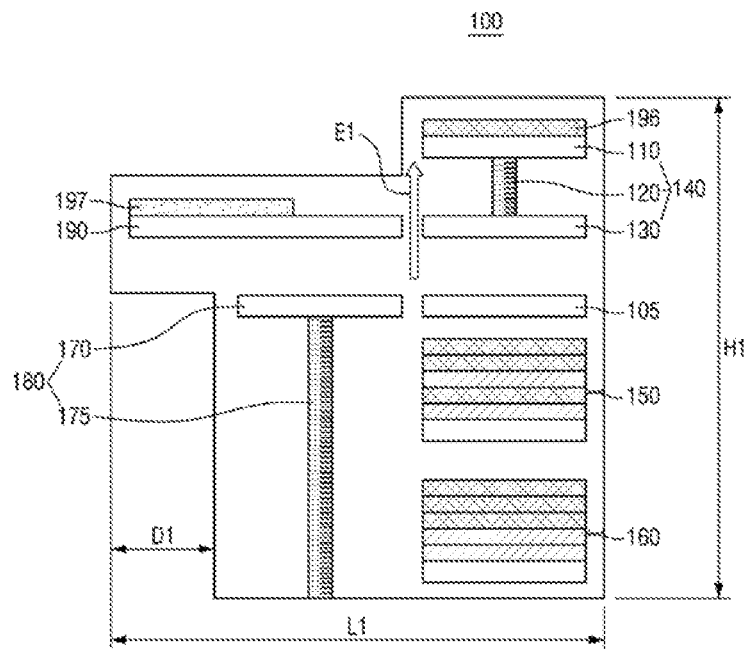
FIG. 1 is a schematic sectional view of a tray feeder according to an exemplary embodiment.

FIG. 1 is a schematic sectional view of a tray feeder according to an exemplary embodiment.

Referring to FIG. 1, the tray feeder 100 according to an exemplary embodiment includes magazines 150 and 160, a buffer member 140, a feeding member 190, an inserting/extracting member 180 and a refilling member 105.

The magazines 150 and 160 are spaces where pallets supporting trays are housed, and the pallets support trays and control the trays to be transferred. The pallets are housed in multi-layered structures formed in the magazines 150 and 160 and are placed in stacks.

In the present exemplary embodiment, the magazines 150 and 160 may be fixed and include a top magazine 150 and a bottom magazine 160. Here, there is no limitation in the number of magazines constituting the magazines 150 and 160. Since the magazines 150 and 160 housing the pallets are fixed, they are not necessarily elevated or lowered, thereby reducing an overall height H1 of the tray feeder 100. As a result, an operator's range of vision in an operating field can be secured. Thus, it is easy to figure out the entire operation proceeding status. In addition, in a case where an operating failure occurs, an operator can rapidly correct the error.

In addition, in a case where a part adsorbing error occurs to an operating head of a part mounting device (not shown), since the overall height H1 of the tray feeder 100 is small, the operator can easily correct the part adhering error in vicinity of an adhering space without the need to move to a lateral side of the tray feeder 100. As a result, an extra space is not necessarily provided in the lateral side of the tray feeder 100, thereby shortening a production line.

Meanwhile, trays housed in the magazines 150 and 160 may be classified as a tray having parts accommodated in the entire accommodation space of the tray and a tray having parts accommodated in only a portion of the accommodation space of the tray. In order to mount parts on a board, the parts accommodated in trays may be mounted on the board all at once. Alternatively, only some parts may first be mounted on the board and the remaining parts may then be mounted. Thus, the magazines 150 and 160 may have trays accommodated in the above-described manner.

Referring again to FIG. 1, a tray 196 indicated by cross-hatching is a tray having parts accommodated in the entire accommodation space of the tray, and a tray 197 indicated by dot-hatching or trays in the magazines 150 and 160 indicated by oblique-hatching have parts accommodated in only a portion of the accommodation space thereof. That is to say, the type of hatching indicates an extent of parts accommodated in the tray.

The buffer member 140 may be positioned above the magazines 150 and 160, and is a space in which pallets supporting mounted or to-be-mounted trays are standing by. The buffer member 140 may include a top buffer member 110 and a bottom buffer member 130. In the current exemplary embodiment, the top buffer member 110 is a place where among the trays, a standby tray 196 having parts to be mounted on a board is temporarily positioned, and the bottom buffer member 130 is a place where among the trays, a mounted tray of which parts have already been mounted on the board is temporarily positioned.

In FIG. 1, the standby tray 196 positioned in the top buffer member 110 is indicated by cross-hatching. However, even in a case of a tray having parts accommodated in only a portion of the accommodation space thereof, if parts accommodated in the tray are to be mounted on a board, it may be considered as a standby tray standing by in the top buffer member 110. That is to say, a standby tray and a mounted tray can be distinguished from each other according to whether parts accommodated in a tray have been mounted or are to be mounted, rather than according to the extent of parts accommodated in the tray.

The buffer member 140 may include an elevating device 120. The elevating device 120 controls the buffer member 140 to move up and down. As the buffer member 140 can be elevated or lowered, a tray may be moved between the feeding member 190, the inserting/extracting member 180 and the buffer member 140 by adjusting their heights so as to be level with one another.

Unlike in FIG. 1, the buffer member 140 may include a plurality of stacks, on which trays are supported. Since a plurality of trays can stand by in the plurality of stacks of the buffer member 140, an operating time can be reduced.

Figure 38:
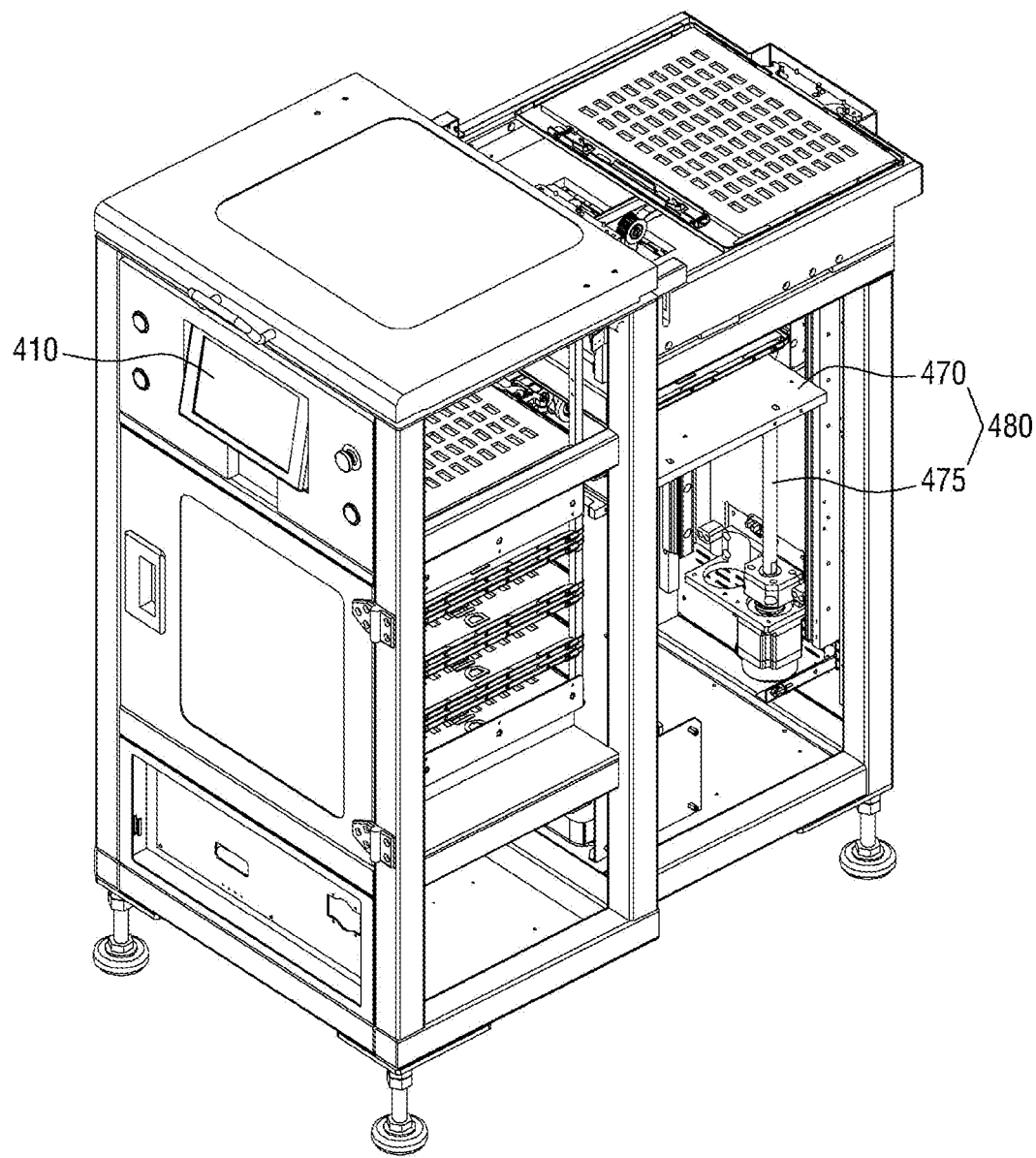
FIGS. 38 and 40 are perspective views of a tray feeder according to exemplary embodiments
Figure 39:
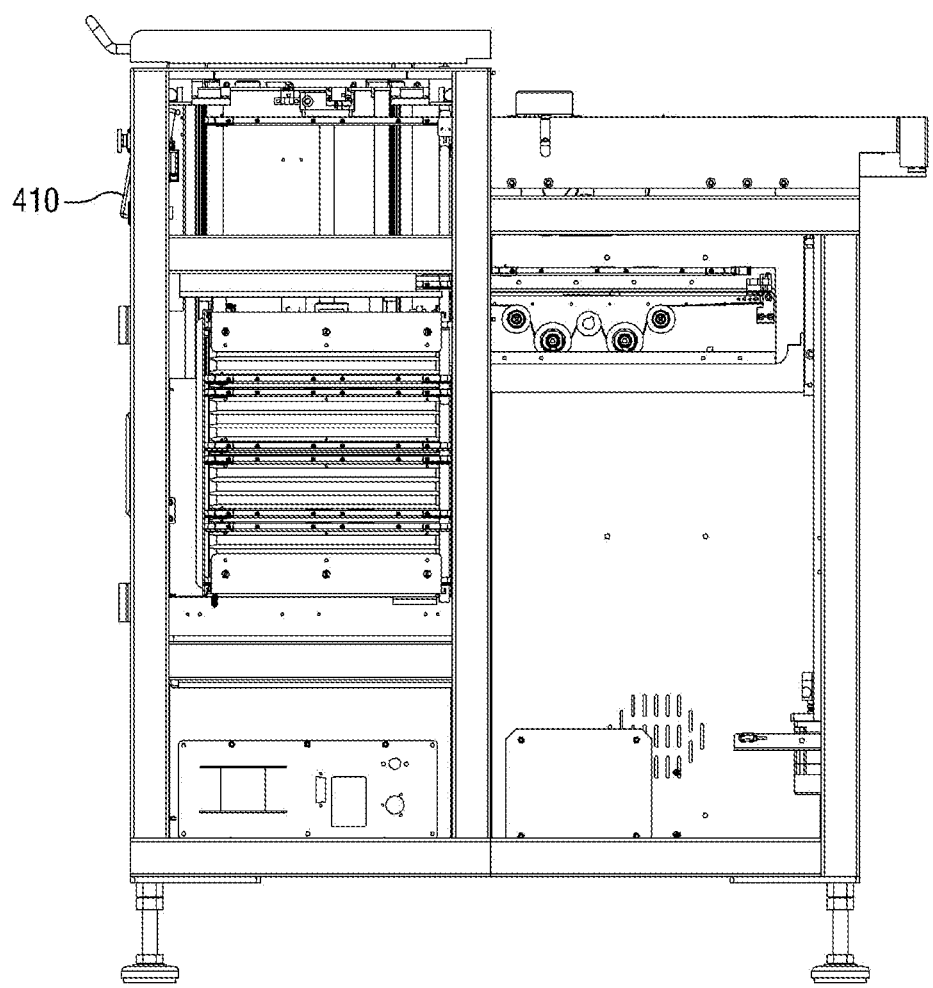
FIG. 39 is a side view of the tray feeder of FIGS. 38 and 40, according to exemplary embodiments
Figure 40:
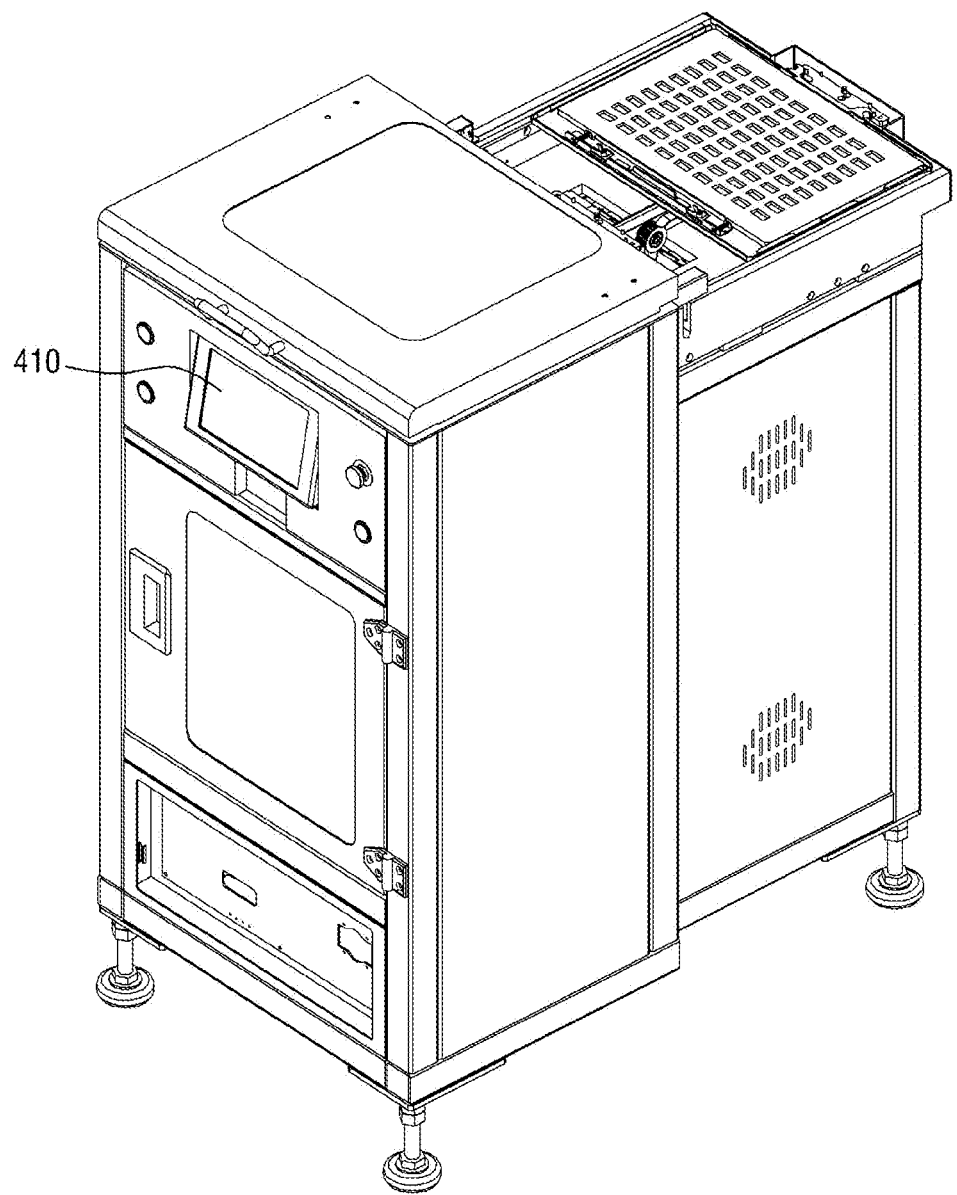

In addition, the tray feeder 100 has an opening 490 (as shown in FIGS. 38-40), and trays standing by in the buffer member 140 are refilled with parts. New parts may be refilled in the tray through the opening 490 and particular parts can be removed from the tray. There is no limitation in the location of the opening 490. For example, the opening 490 may be located at a region positioned above the buffer member 140.

The feeding member 190 may support a pallet to control an operating head of a part mounting device to adhere parts accommodated in the tray. That is to say, the feeding member 190 may be an operating field space in which parts are provided to the part mounting device. The feeding member 190 inserts the standby tray 196 standing by in the top buffer member 196 into itself using an insertion device to control parts to be provided to the operating head of the part mounting device. As shown in FIG. 1, the tray 197 having parts accommodated only in a portion of the accommodation space thereof is placed on the feeding member 190 and the parts can later be adhered by the operating head.

The inserting/extracting member 180 may extract a pallet housed in the magazine 150 or 160 or may insert a mounted pallet, supporting a tray from which parts have been mounted, into the magazine 150 or 160. The inserting/extracting member 180 may include an inserting/extracting plate 170, an elevating device 175 and an inserting/extracting device (not shown).

First, the inserting/extracting member 180 is moved by the elevating device 175 to a particular height of the magazine 150 or 160 having a pallet housed therein, and the housed pallet is extracted using the inserting/extracting device. The extracted pallet may be transferred to the buffer member 140.

In addition, the mounted pallet in the buffer member 140 is inserted using the inserting/extracting device, and is then moved to a particular height of the magazine 150 or 160 using the elevating device 175. Then, the pallet may be inserted into a place of the magazine 150 or 160.

The inserting/extracting member 180 may be positioned under the feeding member 190. Thus, a lengthwise width L1 of the tray feeder 100 may be reduced, thereby reducing a space occupied by the tray feeder 100 in an operating field and permitting an operator to move freely. In addition, since a distance ranging from the magazine 150 or 160 to the feeding member 190 is reduced, the operator can easily correct, for example, a part adhering error.

The inserting/extracting member 180 may include a plurality of inserting/extracting plates. Therefore, a plurality of trays can be extracted from the magazine all at once.

Referring to FIG. 1, a length difference D1 between the inserting/extracting member 180 and the feeding member 190 may vary according to the movement distance of the operating head of the part mounting device positioned in front of the tray feeder 100. As the movement distance of the operating head increases, it is not necessary for the feeding member 190 to protrude forward and the length difference D1 between the inserting/extracting member 180 and the feeding member 190 may be zero (0). That is to say, when the length difference D1 is 0, the lengthwise width L1 of the tray feeder 100 may further be reduced because the feeding member 190 does not protrude forward.

The refilling member 105 supports an empty tray having all parts adhered and no more parts accommodated therein, and has the empty tray refilled with new parts. As a result of mounting, the empty tray may be transferred to the refilling member 105 using the inserting/extracting member 180. Thereafter, the empty tray supported by the refilling member 105 is collected automatically or manually by the operator to be again fed to the tray feeder 100 after being refilled with new parts.

The refilling member 105 may be positioned between the buffer member 140 and the magazines 150 and 160, but the exemplary embodiment does not limit the location of the refilling member 105 installed thereto. The refilling member 105 may be positioned above the buffer member 140. If the refilling member 105 is positioned in an empty space between the buffer member 140 and the magazines 150 and 160, it is possible to reduce the overall height of the tray feeder 100.

Additionally, the tray feeder 100 according to the current exemplary embodiment may further include a controller (not shown). The controller controls the overall part providing process. Specifically, the controller may control a pallet transfer process and may monitor the locations and number of parts accommodated in the tray.

In order to control the pallet transfer process, the controller controls elevating timing and distances of the buffer member 140 and the inserting/extracting member 180, thereby transferring the pallet to a desired location. In addition, the controller may monitor in which tray particular parts are accommodated or whether particular parts accommodated in a particular tray have been adhered by an operating head of a part mounting device.

Figure 2:
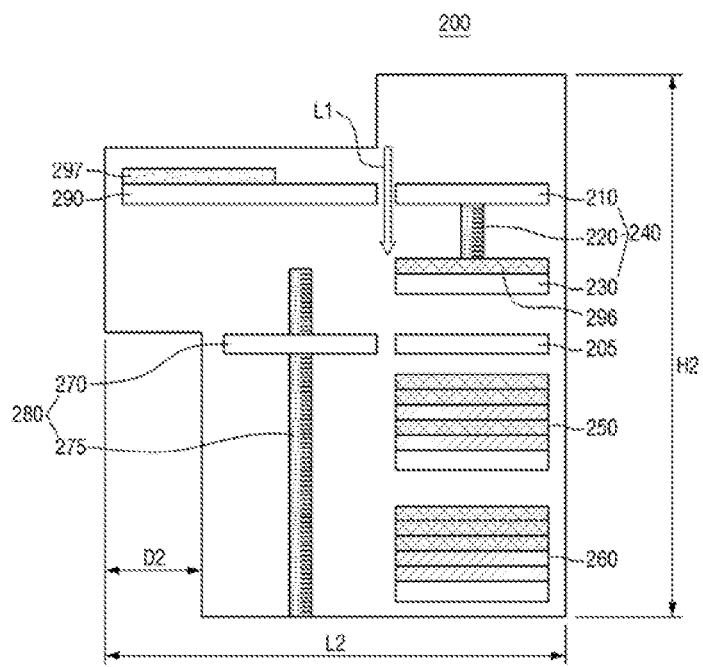
FIG. 2 is a schematic sectional view of a tray feeder according to another exemplary embodiment.

FIG. 2 is a schematic sectional view of a tray feeder according to another exemplary embodiment. The same contents as described above will be omitted.

Referring to FIG. 2, like the tray feeder 100 according to the previous exemplary embodiment, a tray feeder 200 according to the current exemplary embodiment includes magazines 250 and 260, a buffer member 240, a feeding member 290, an inserting/extracting member 280, a refilling member 205 and a controller (not shown). However, unlike in the previous exemplary embodiment shown in FIG. 1, in the current exemplary embodiment, a standby tray 296 may be temporarily positioned in a bottom buffer member 230.

The magazines 250 and 260 include a top magazine 250 and a bottom magazine 260, and a refilling member 205 may be positioned above the magazines 250 and 260. The buffer member 240 may include a top buffer member 210, the bottom buffer member 230 and an elevating device 220. A feeding member 290 is a space in which a mounting operation is performed, and the inserting/extracting member 280 may be positioned under the feeding member 290. The inserting/extracting member 280 may include an inserting/extracting plate 270, an elevating device 275 and an inserting/extracting device (not shown).

In addition, like in the previous exemplary embodiment, use of the magazines 250 and 260 may reduce a height H2 of the tray feeder 200 and the inserting/extracting member 280 is positioned under the feeding member 290, a lengthwise width L2 of the tray feeder 200 may be reduced, thereby easily correcting, for example, a part adhering error.

Like in the previous exemplary embodiment, in the current exemplary embodiment, a length difference D2 between the inserting/extracting member 280 and the feeding member 290 may become 0, the width of the tray feeder 200 may further be reduced, thereby enhancing the efficiency of utilizing an operating field space.

Figure 3:
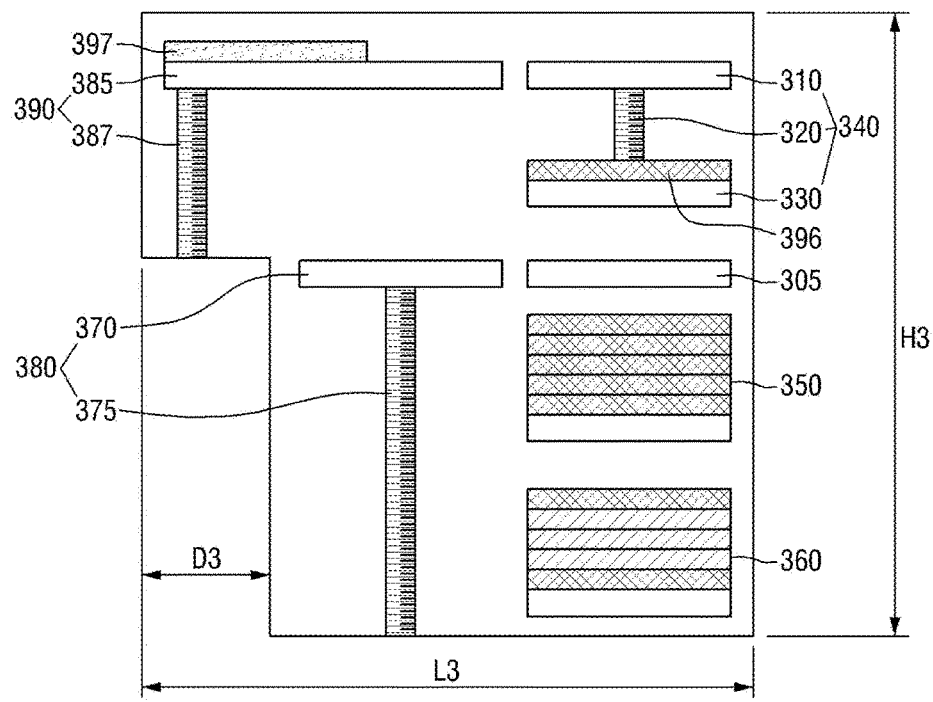
FIG. 3 is a schematic sectional view of a tray feeder according to still another exemplary embodiment.

FIG. 3 is a schematic sectional view of a tray feeder according to still another exemplary embodiment. The same contents as described above will be omitted.

Referring to FIG. 3, like the tray feeder 200 according to the previous exemplary embodiment, a tray feeder 300 according to the current exemplary embodiment includes magazines 350 and 360, a buffer member 340, a feeding member 390, an inserting/extracting member 380, a refilling member 305 and a controller (not shown). In addition, like in the previous exemplary embodiment shown in FIG. 2, a standby tray 396 may be controlled to stand by in a bottom buffer member 330.

The magazines 350 and 360 include a top magazine 350 and a bottom magazine 360, and the refilling member 305 may be positioned above the magazines 350 and 360. The buffer member 340 may include a top buffer member 310, the bottom buffer member 330 and an elevating device 320. A feeding member 390 is a space in which a mounting operation is performed, and the inserting/extracting member 380 may be positioned under the feeding member 390. The inserting/extracting member 380 may include an inserting/extracting plate 370, an elevating device 375 and an inserting/extracting device (not shown).

Here, the top buffer member 310, which is a component of the buffer member 340, may be elevated or lowered using the elevating device 320. In such a manner, a mounted tray may be transferred to the inserting/extracting member 380 by adjusting the top buffer member 310 to be level with the inserting/extracting member 380 while the top buffer member 310 is elevated or lowered.

Unlike in the previous exemplary embodiments shown in FIGS. 1 and 2, the feeding member 390 includes a feeding plate 385 and an elevating device 387, so that it may be elevated or lowered. While the feeding member 390 is lowered, it may become level with the bottom buffer member 330, thereby inserting the standby tray 396 into the feeding member 390.

As described above, as only the top buffer member 310, instead of the buffer member 340, is elevated or lowered, the feeding member 390 is also elevated or lowered, thereby further reducing an overall height H3 of the tray feeder 300, compared to the previous exemplary embodiments. In such a manner, the overall height H3 and a lengthwise width L3 of the tray feeder 300 can be reduced, so that the tray feeder 300 occupies a reduced area, thereby securing an operator's range of vision in an operating field and widening an operating field space corresponding to the operator's movement range. In addition, an operating failure, such as a part adhering error, can be easily corrected.

Like in the previous exemplary embodiments, in the current embodiment, a length difference D3 between the inserting/extracting member 380 and the feeding member 390 may become 0, the width of the tray feeder 300 may further be reduced, thereby enhancing the efficiency of utilizing an operating field space.

Hereinafter, a part providing method using a tray feeder according to various exemplary embodiments will be described.

Figure 4:
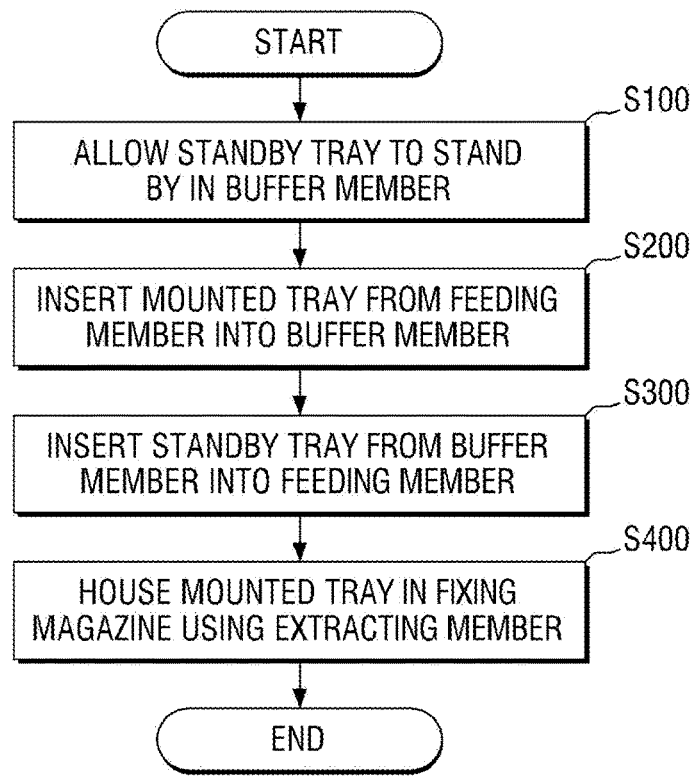
FIG. 4 is a flowchart of a part providing method using a tray feeder according to various exemplary embodiments.
Figure 5:
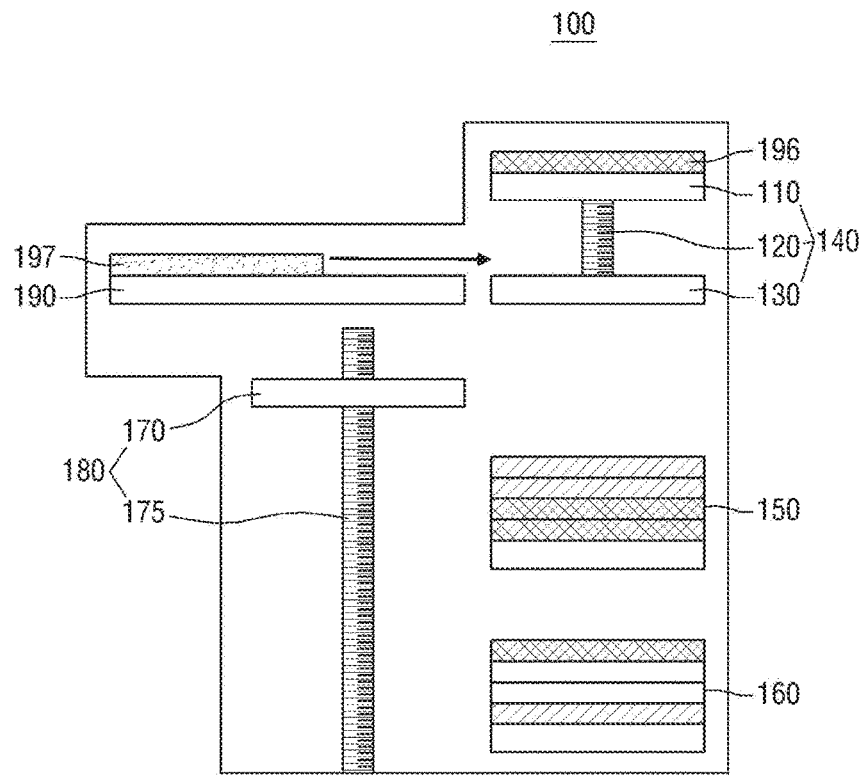
FIGS. 5 to 12 illustrate a part providing method using the tray feeder of FIG. 1, according to an exemplary embodiment.
Figure 6:
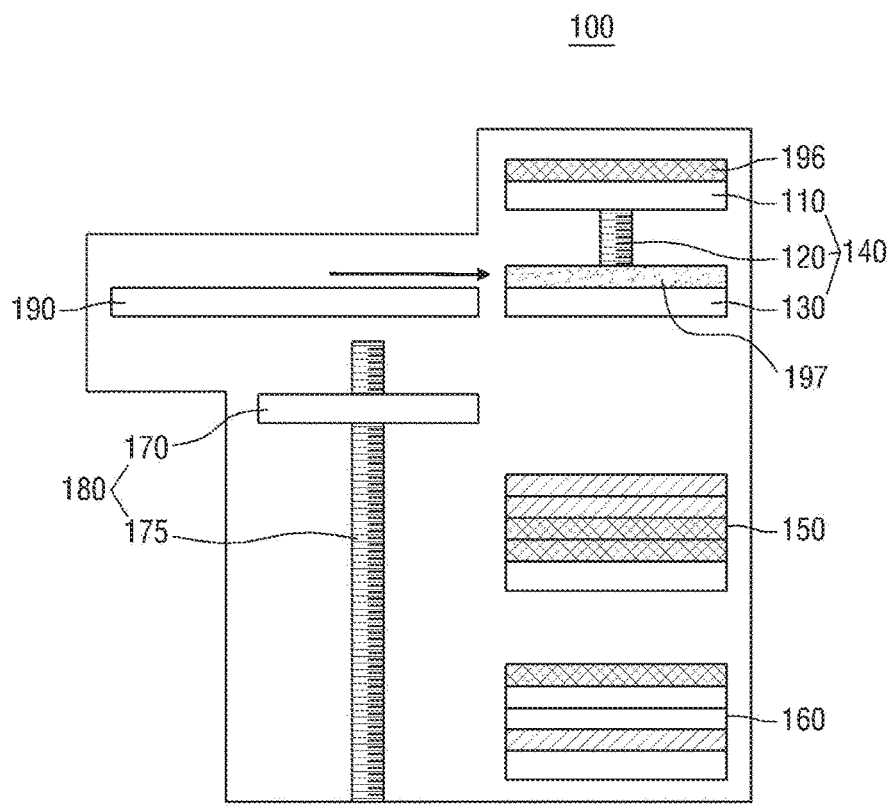
Figure 7:
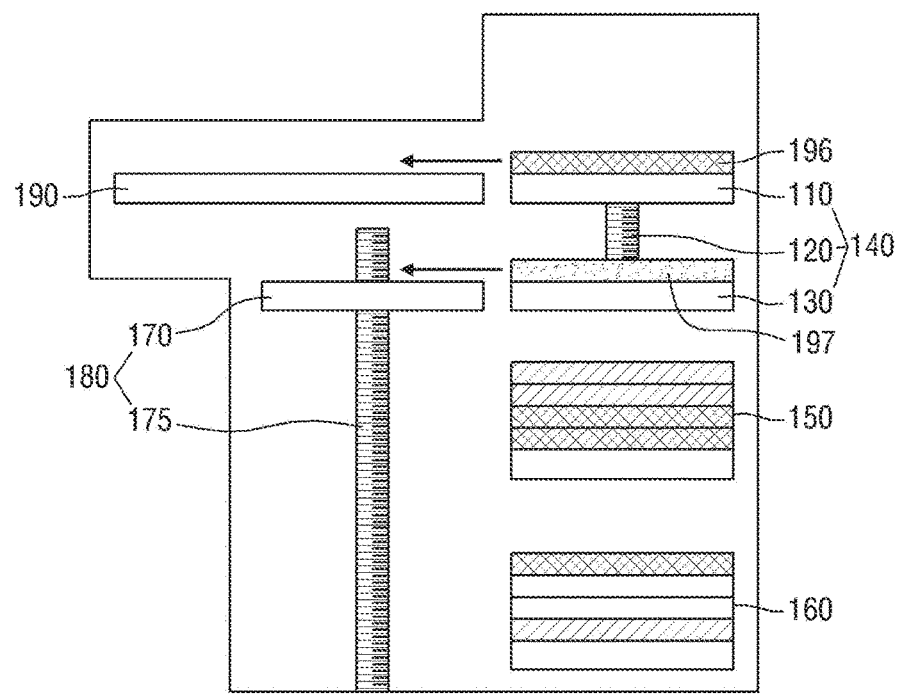
Figure 8:
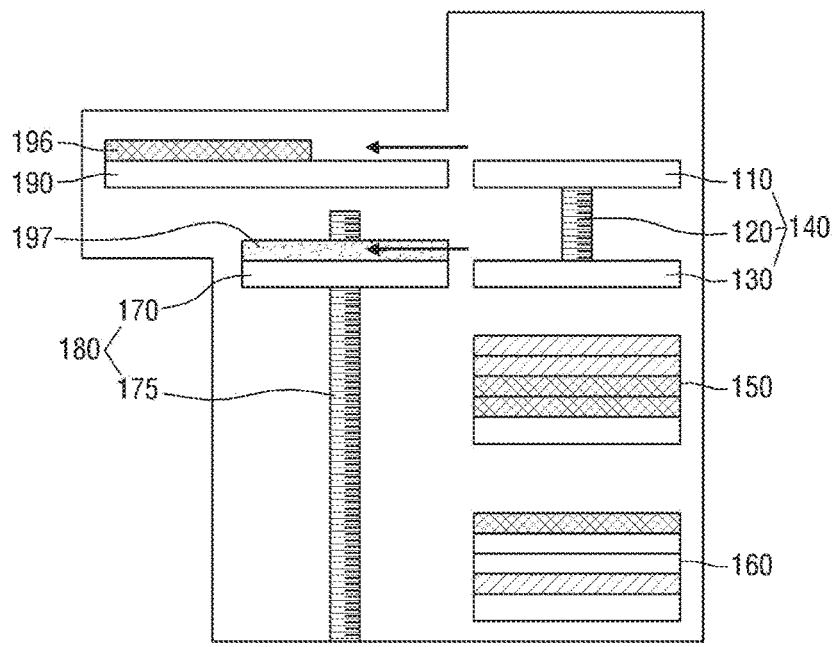
Figure 9:
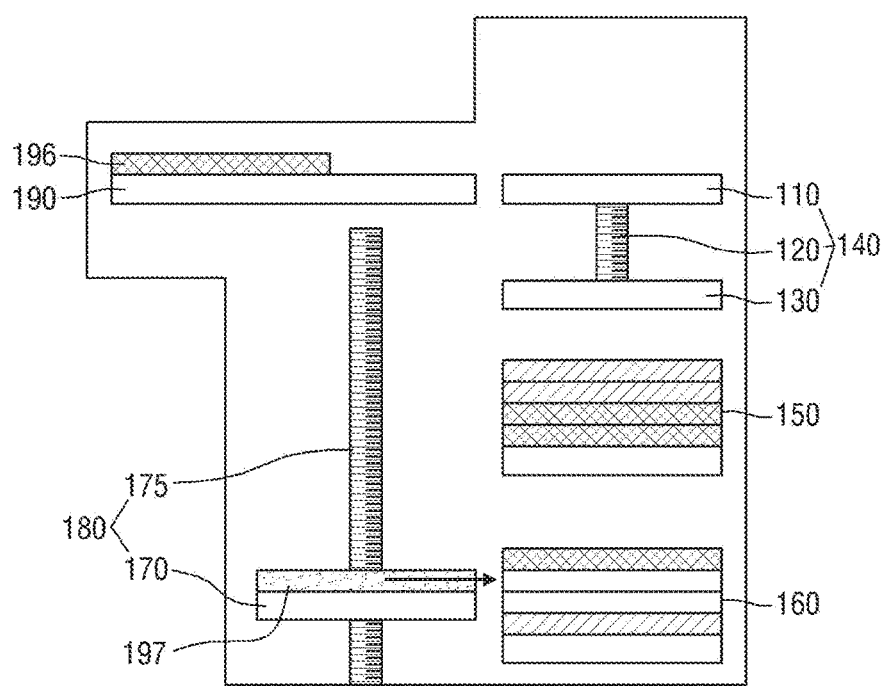
Figure 10:
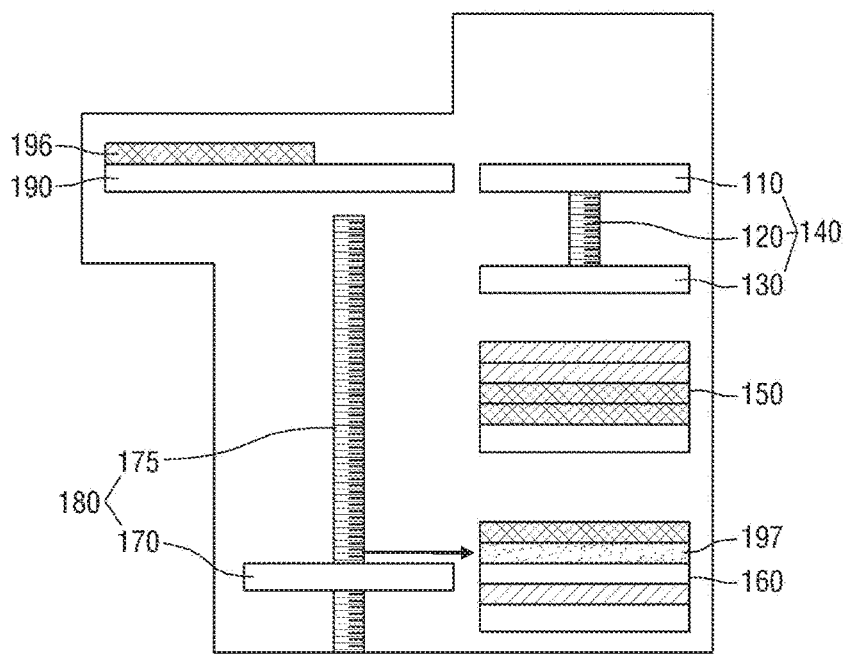
Figure 11:
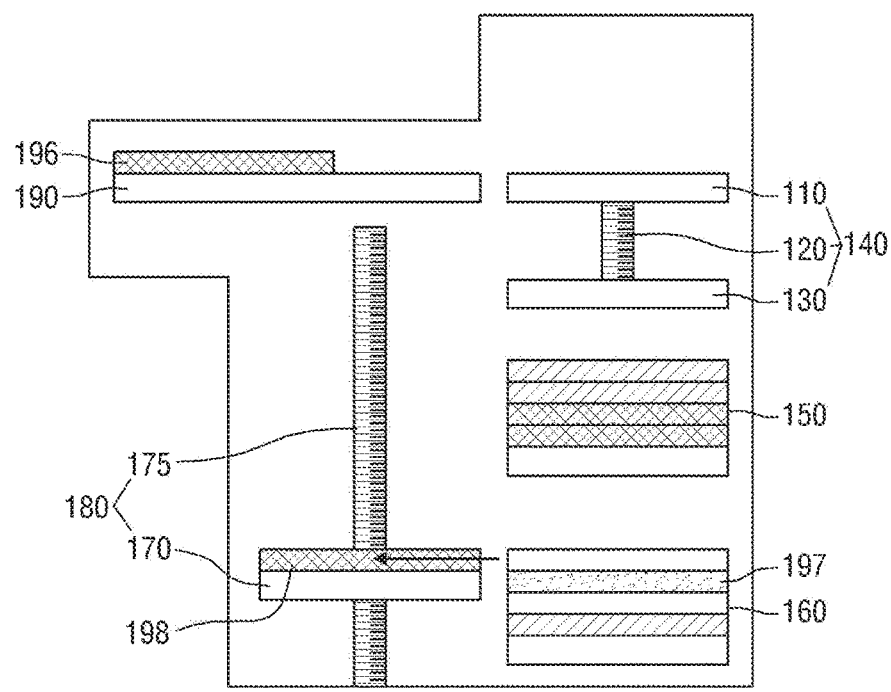
Figure 12:
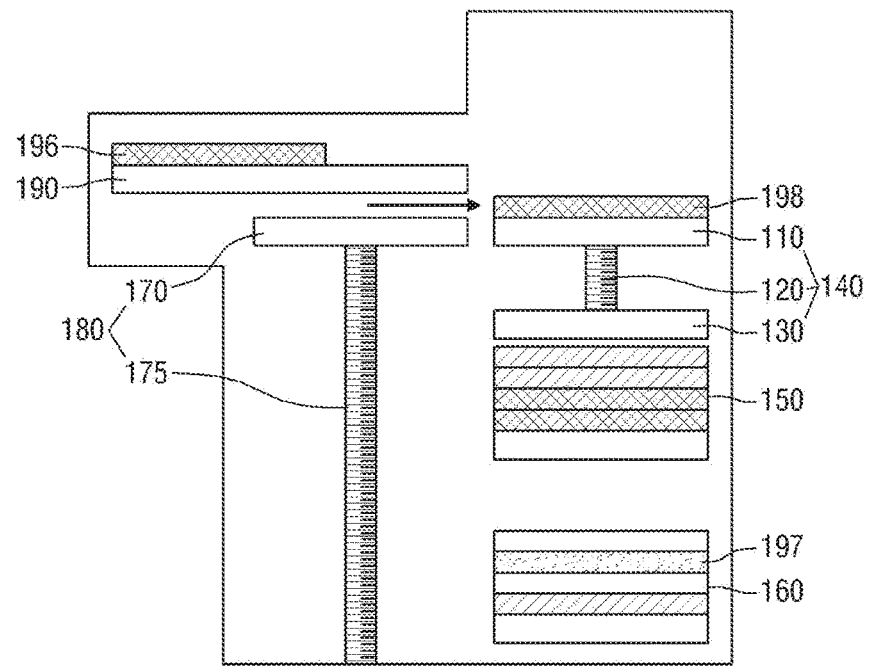
Figure 13:
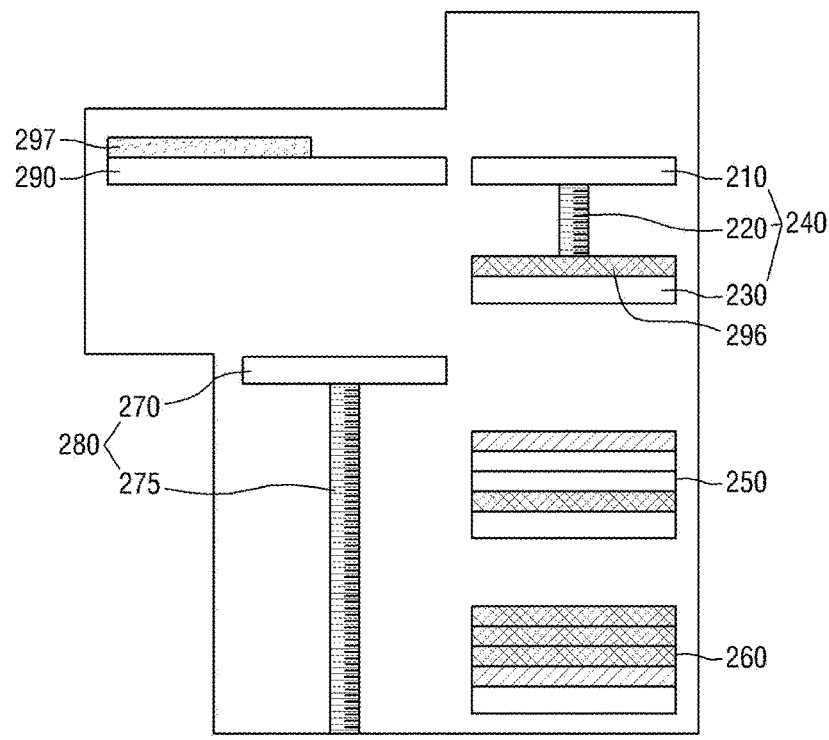
FIGS. 13 to 20 illustrate a part providing method using the tray feeder of FIG. 2, according to another exemplary embodiment.
Figure 14:
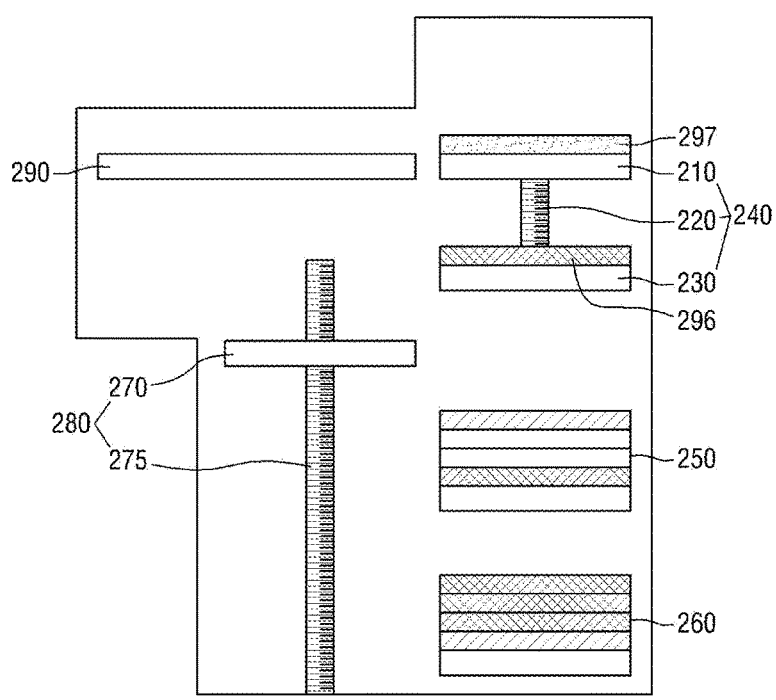
Figure 15:
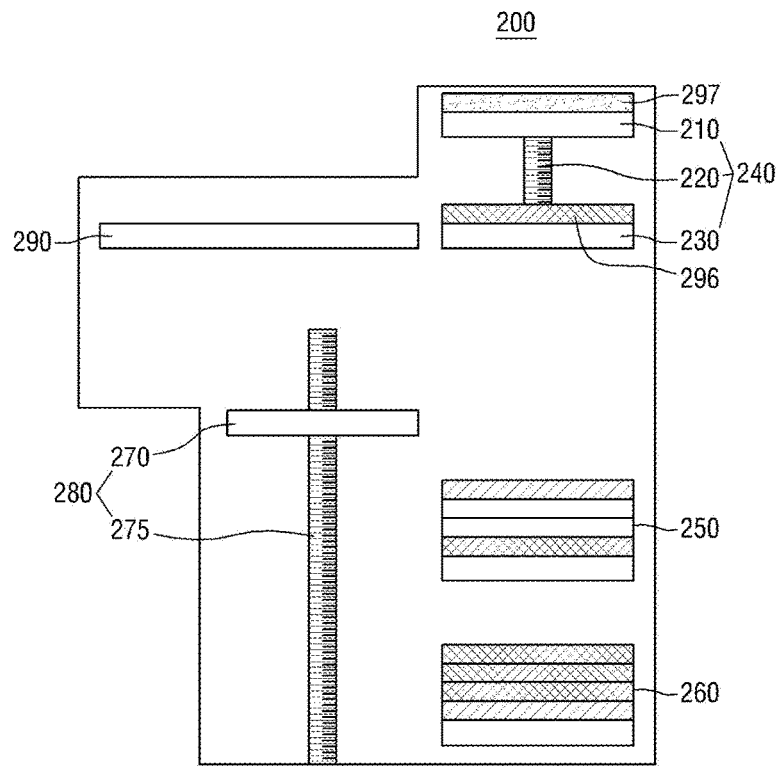
Figure 16:
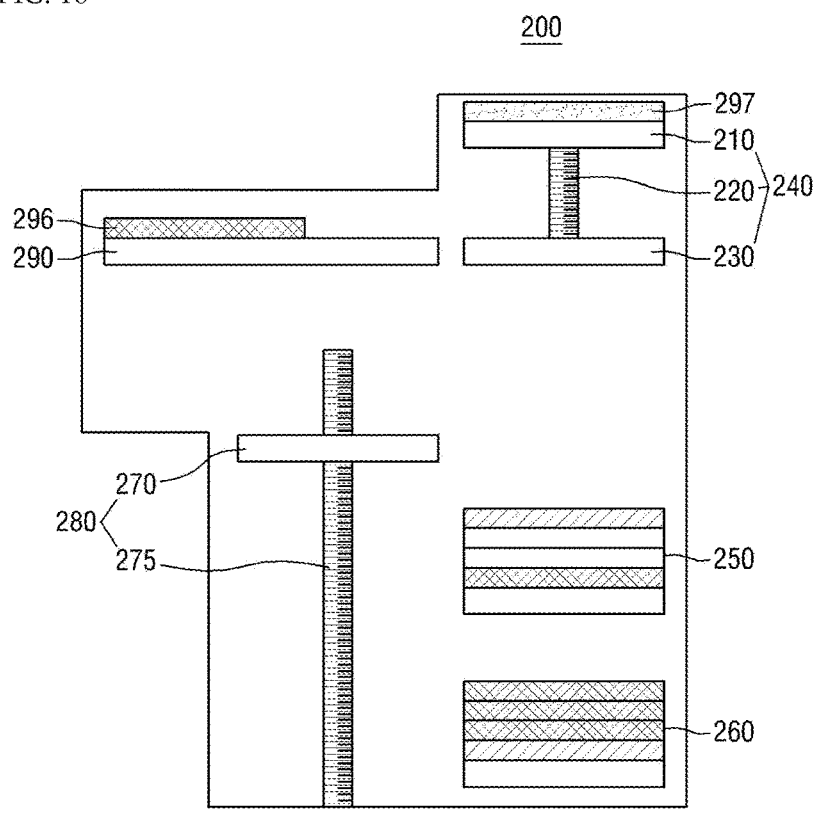
Figure 17:
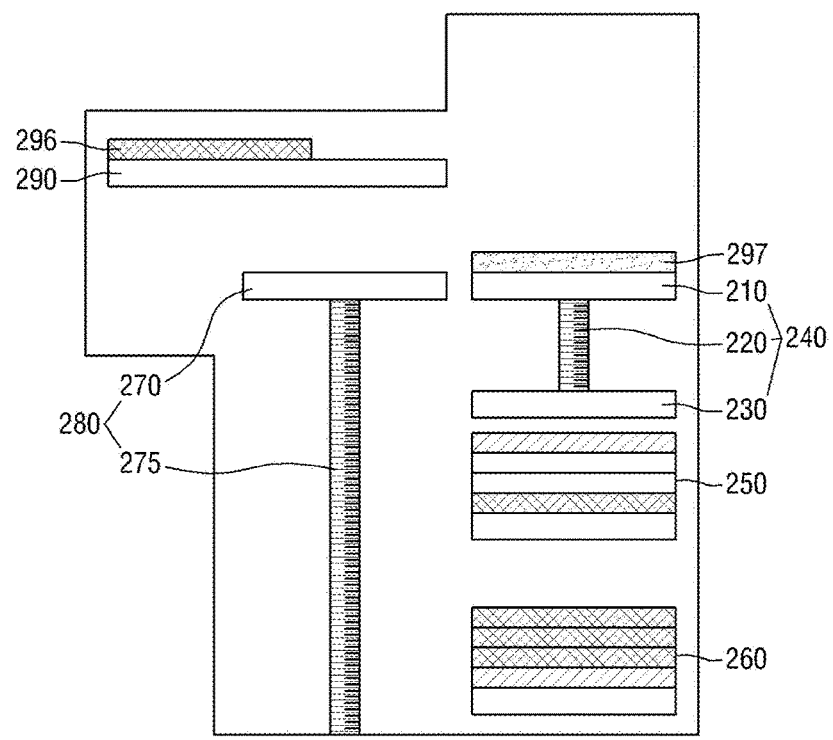
Figure 18:
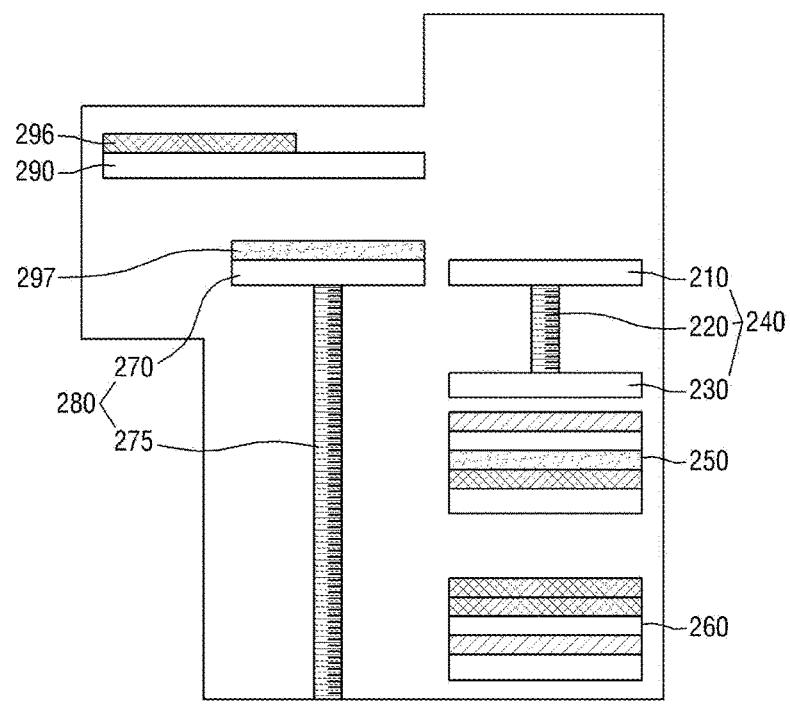
Figure 19:
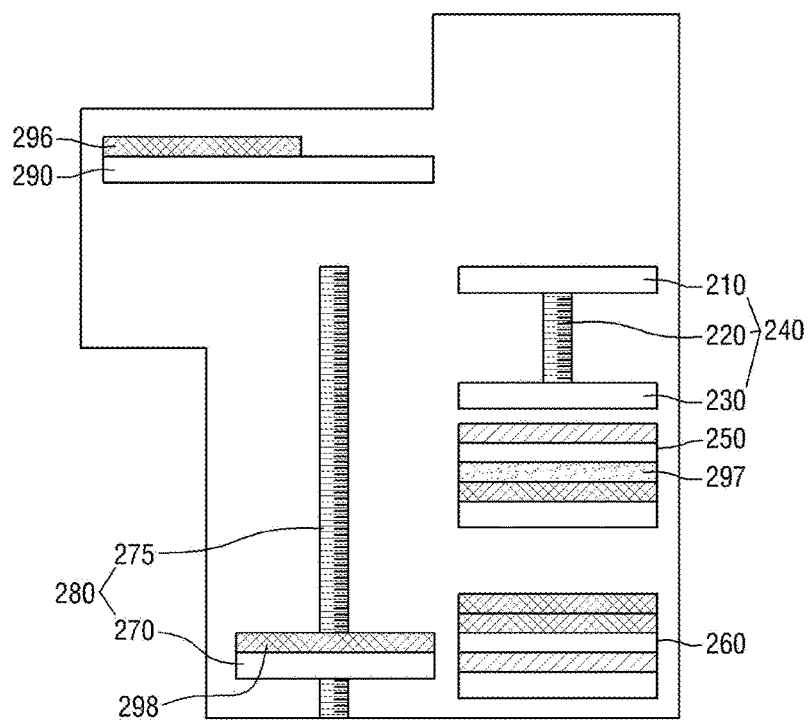
Figure 20:
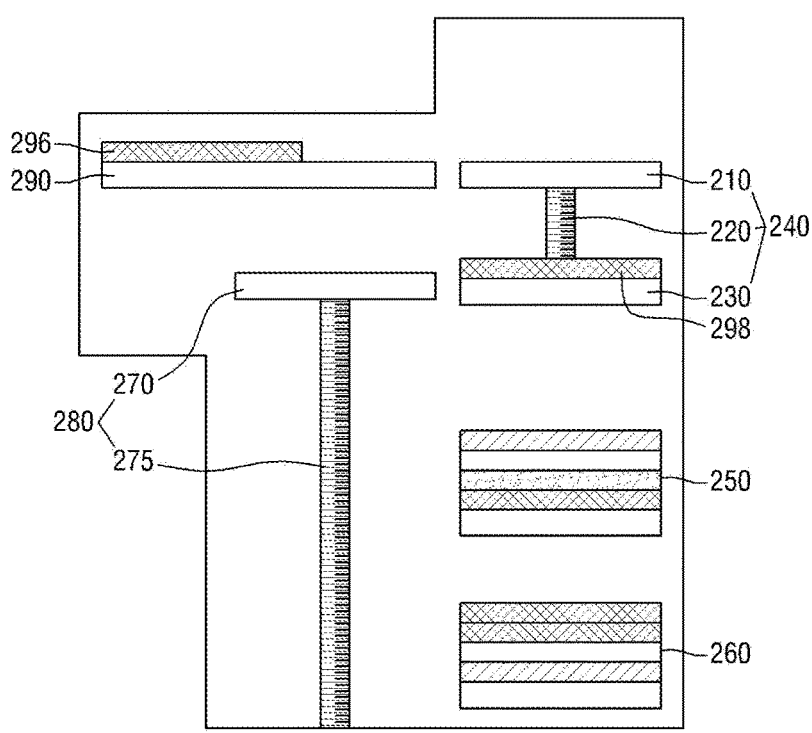
Figure 21:
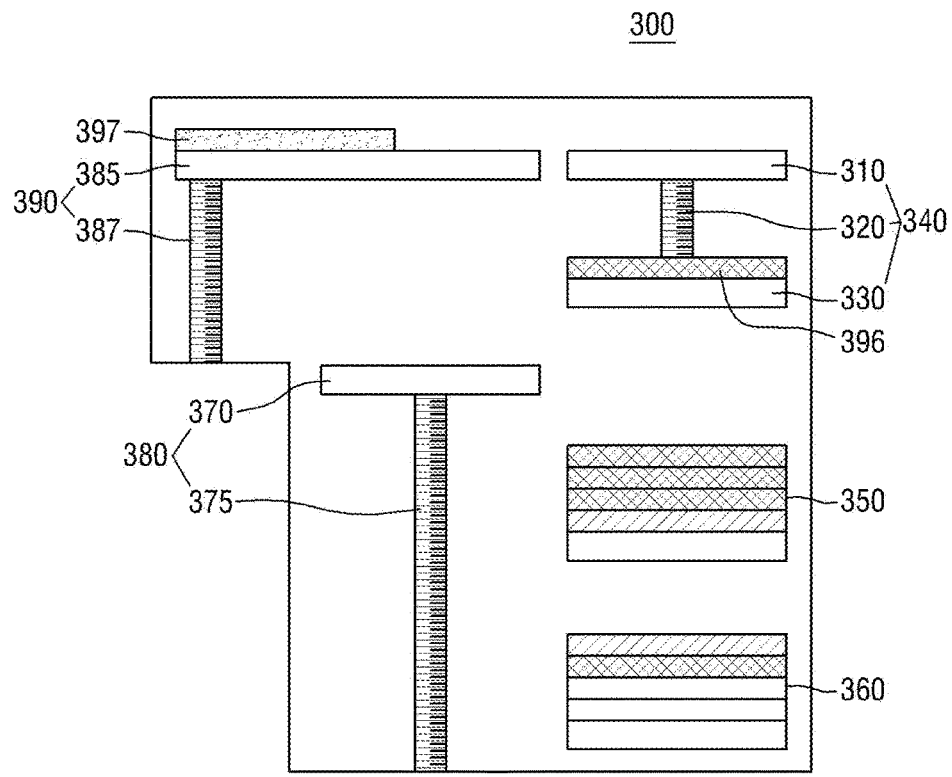
FIGS. 21 to 28 illustrate a part providing method using the tray feeder of FIG. 3, according to still another exemplary embodiment.
Figure 22:
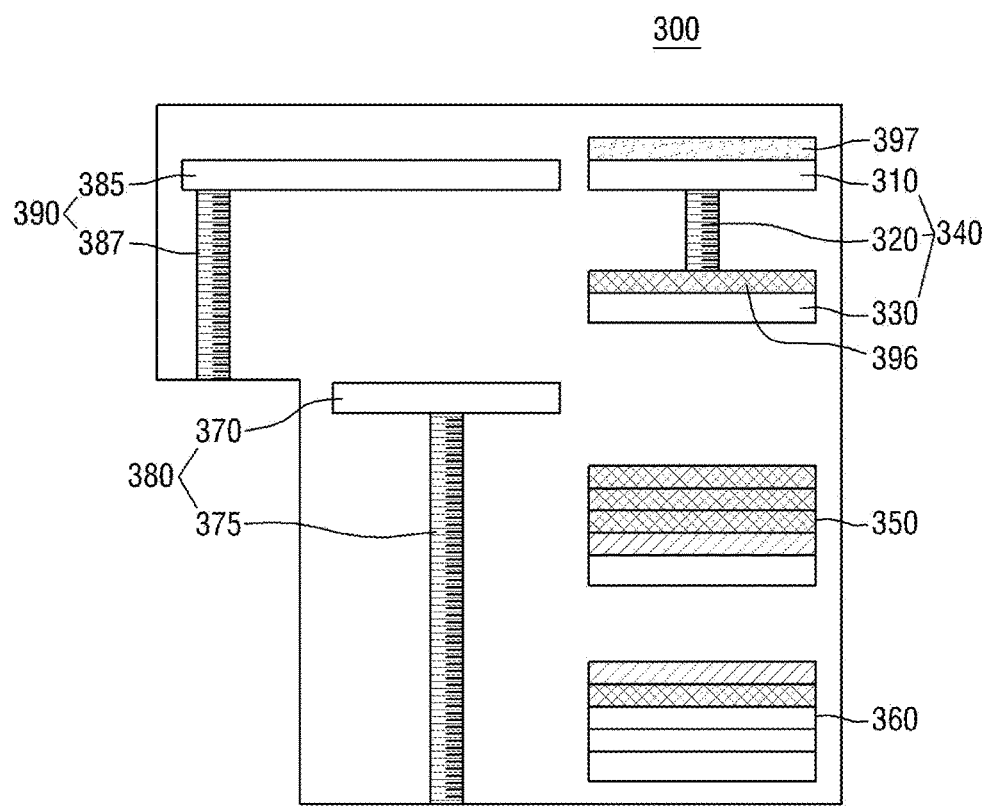
Figure 23:
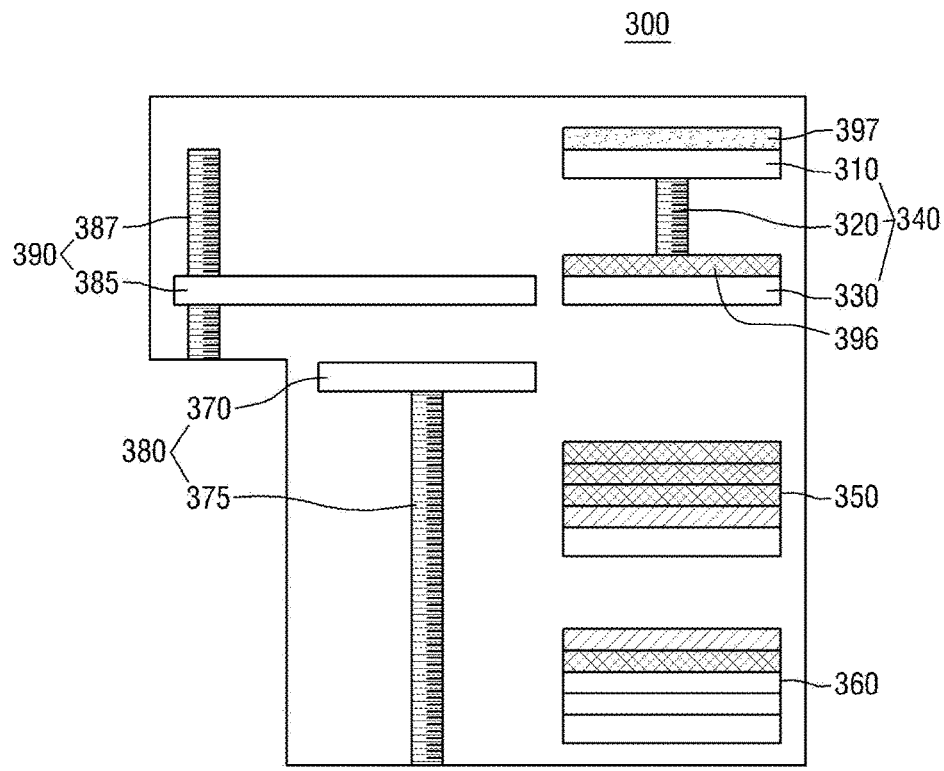
Figure 24:
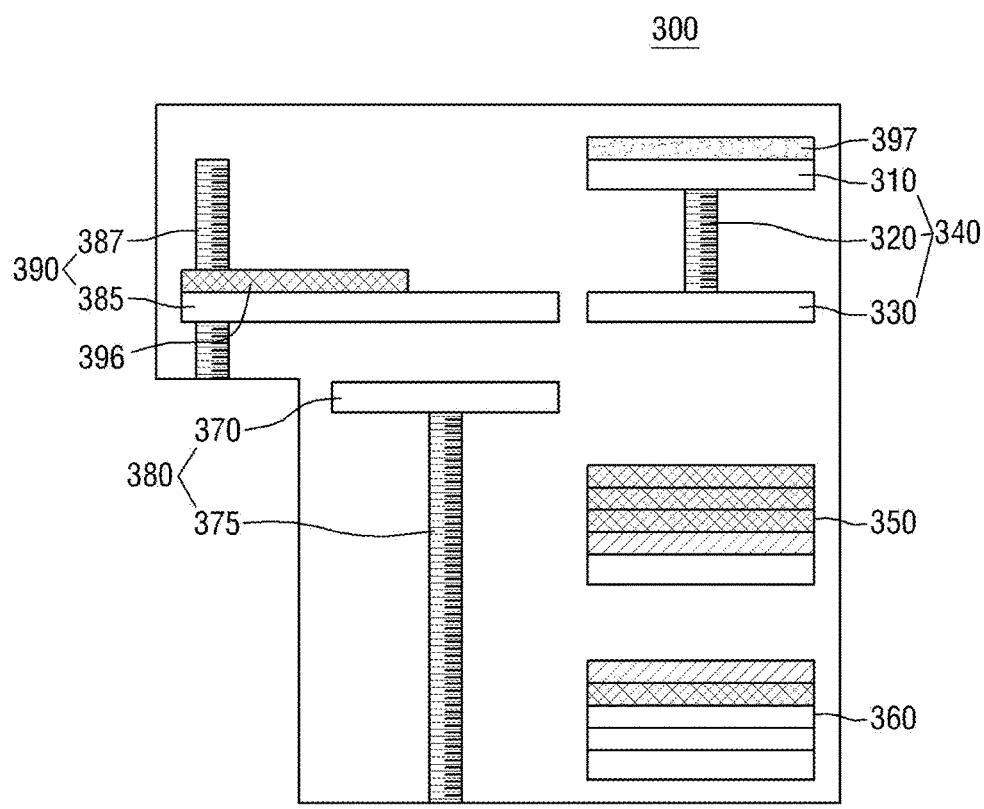
Figure 25:
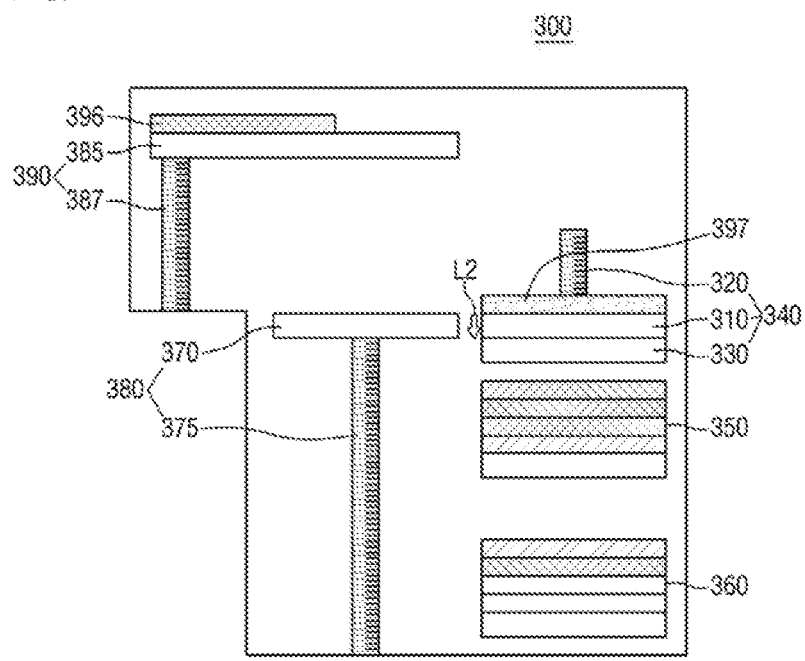
Figure 26:
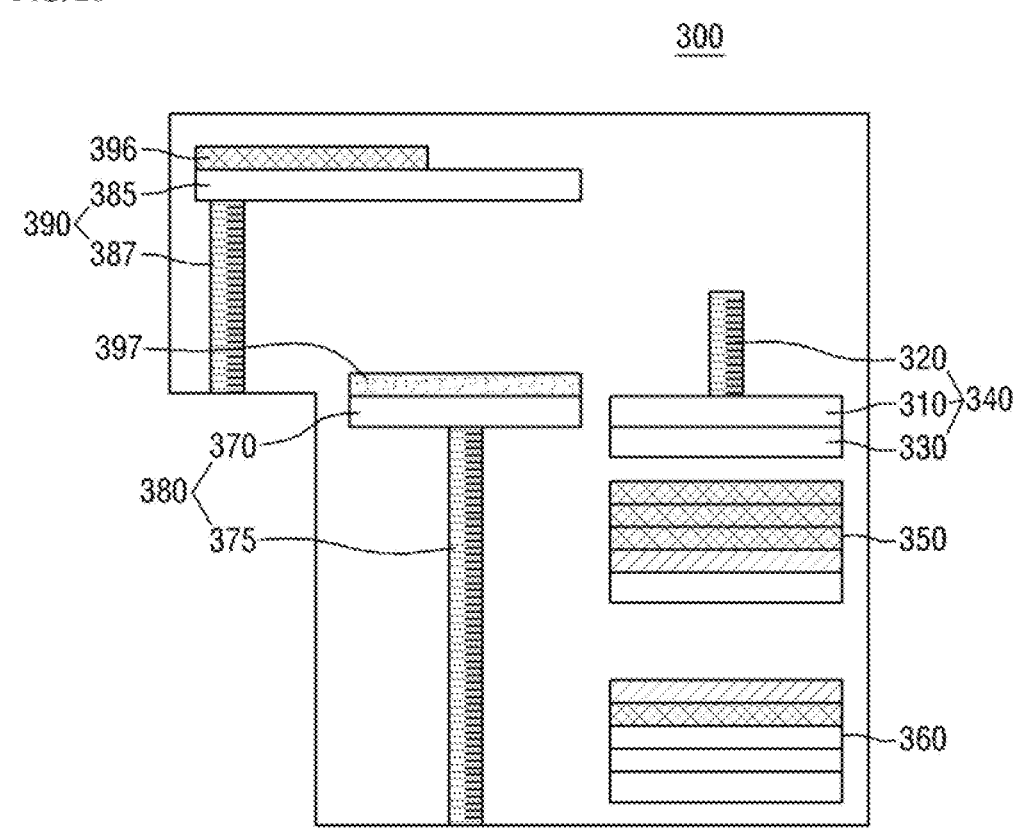
Figure 27:
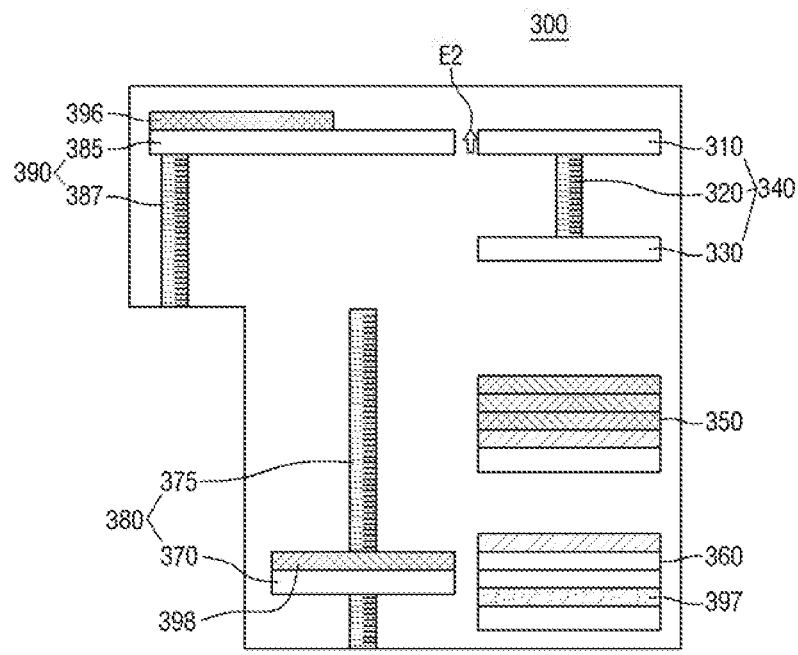
Figure 28:
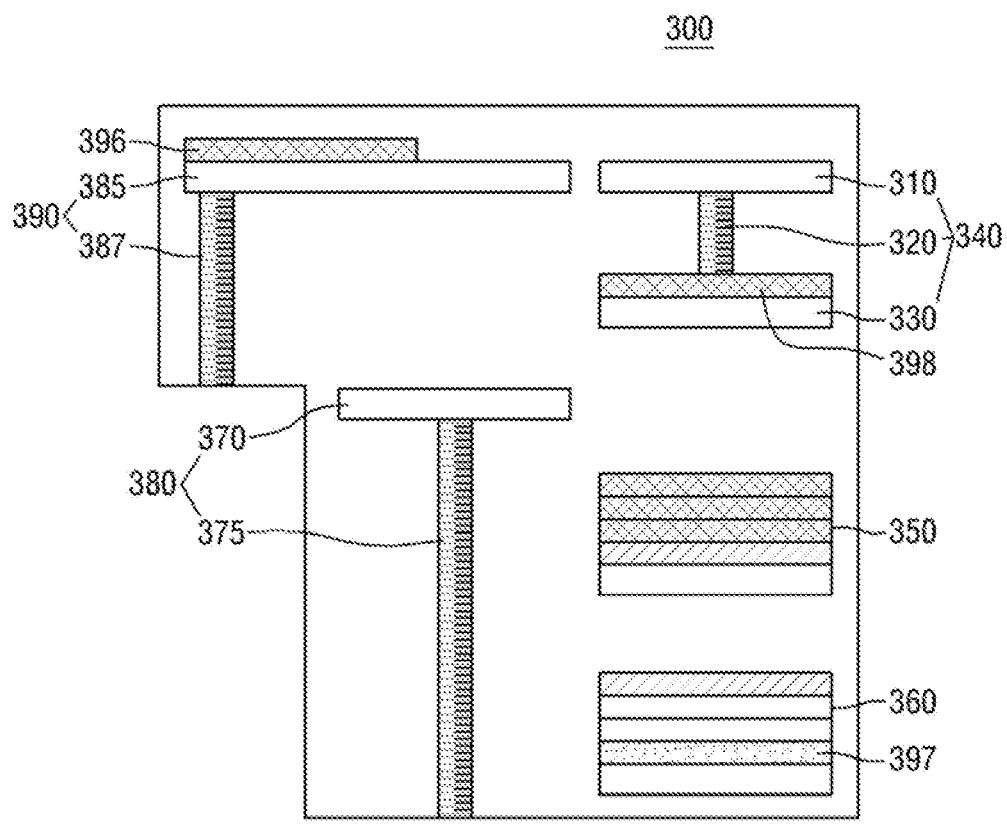
Figure 29:
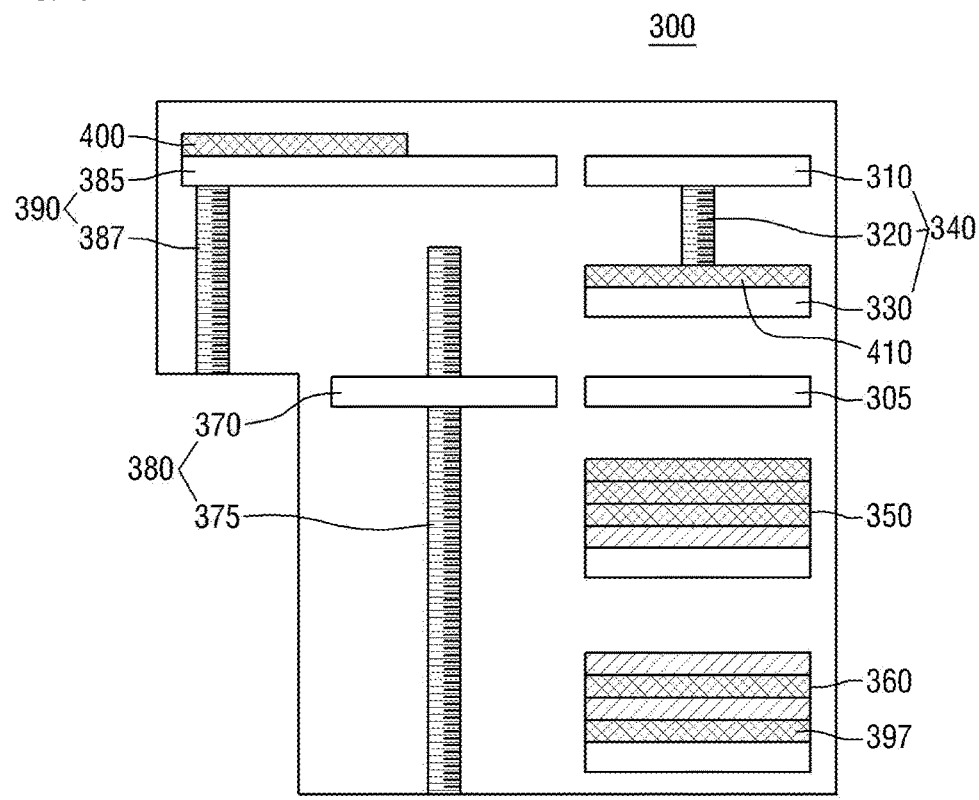
FIGS. 29 to 37 illustrate a refilling method of an empty tray using the tray feeder of FIG. 3, according to still another exemplary embodiment.
Figure 30:
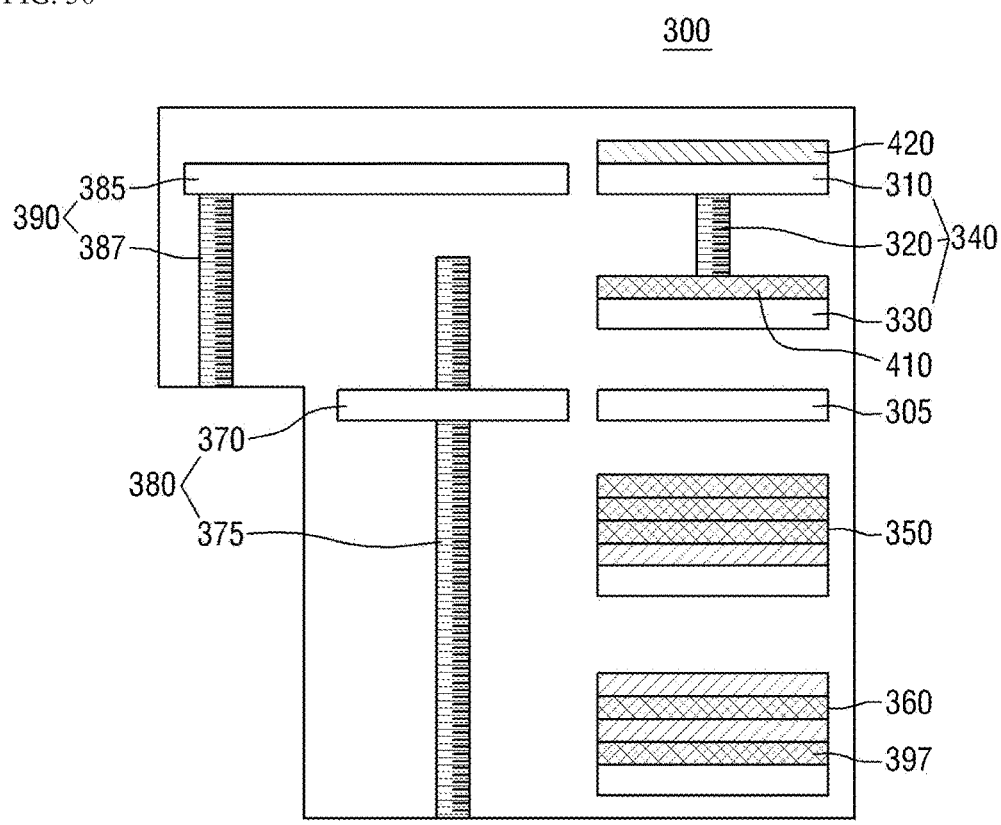
Figure 31:
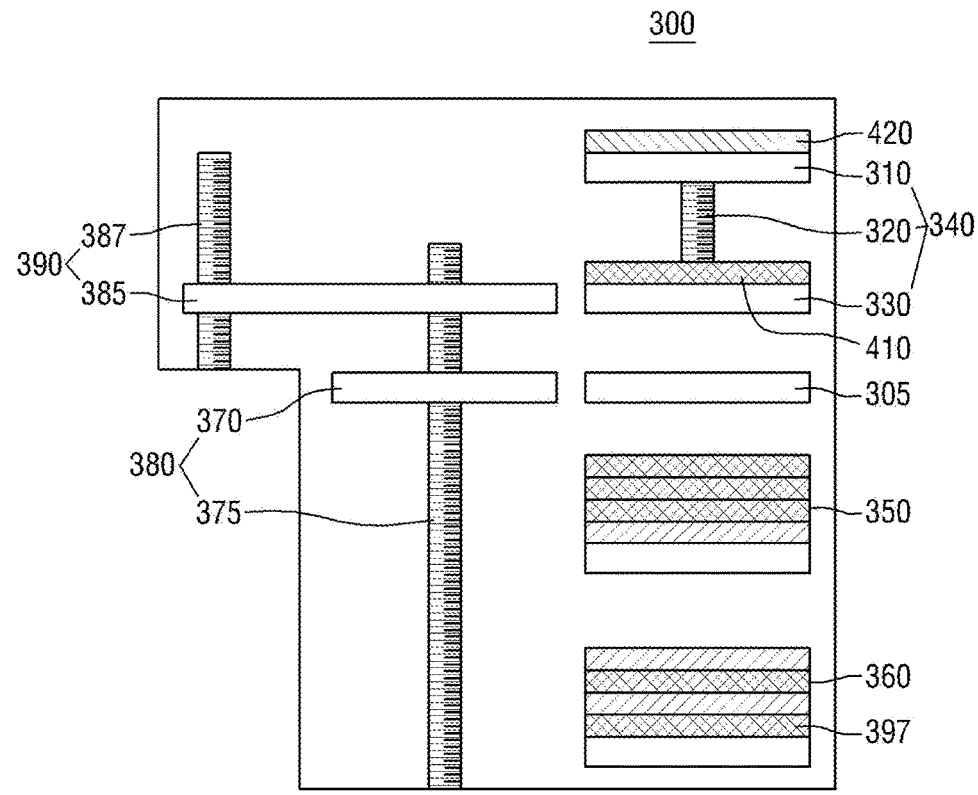
Figure 32:
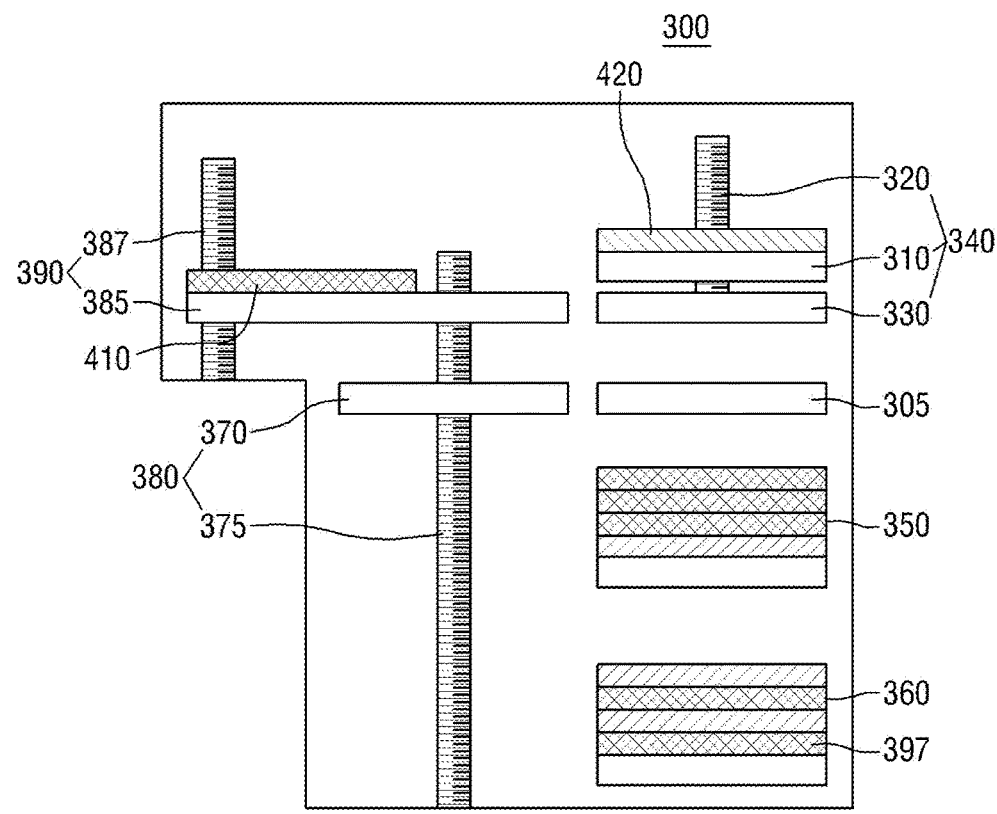
Figure 33:
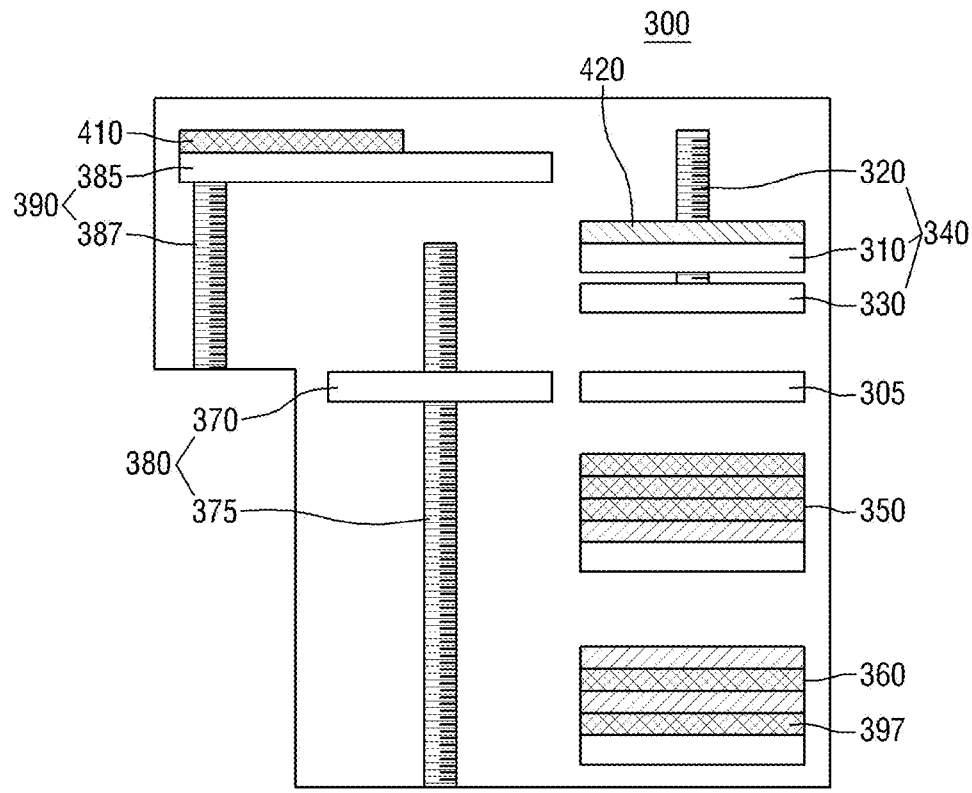
Figure 34:
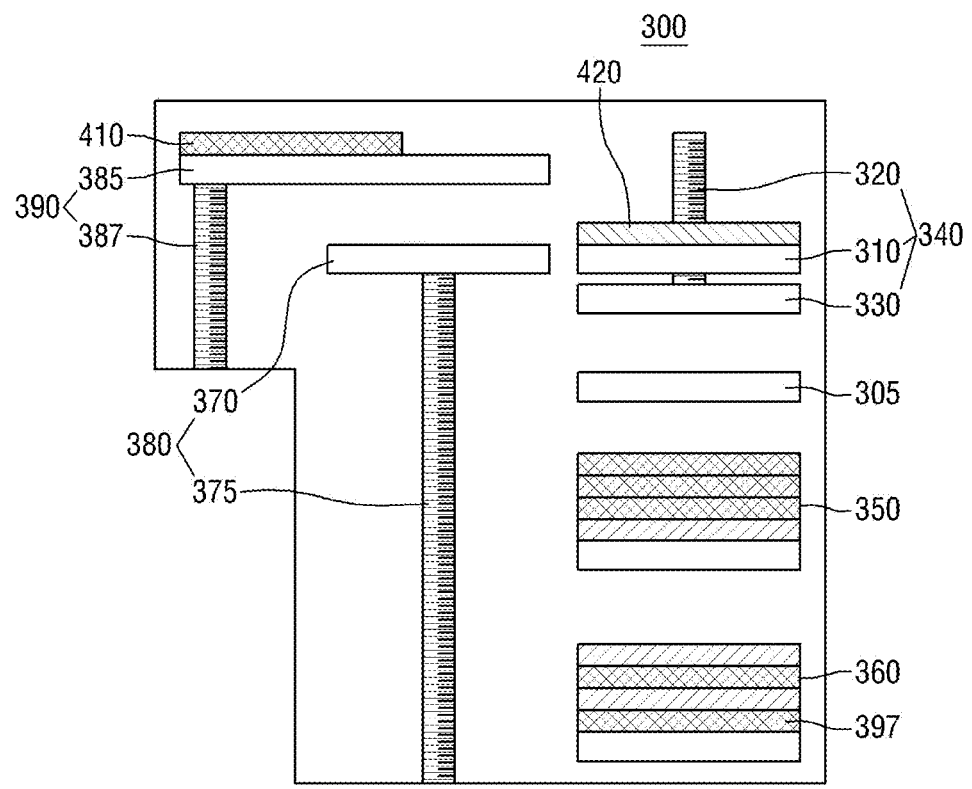
Figure 35:
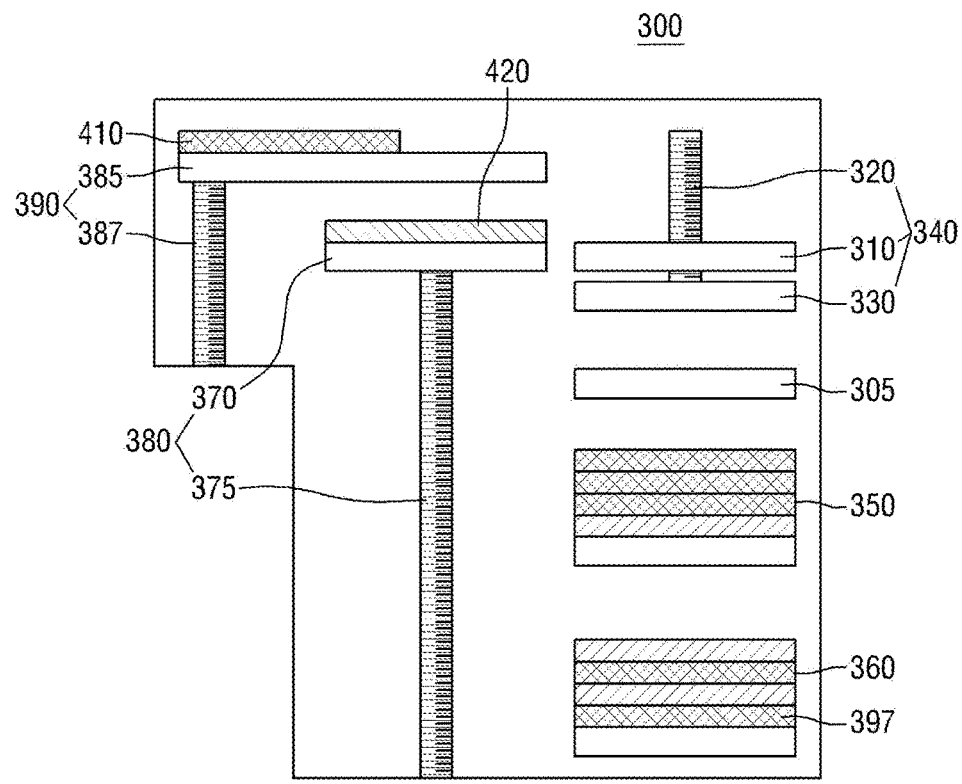
Figure 36:
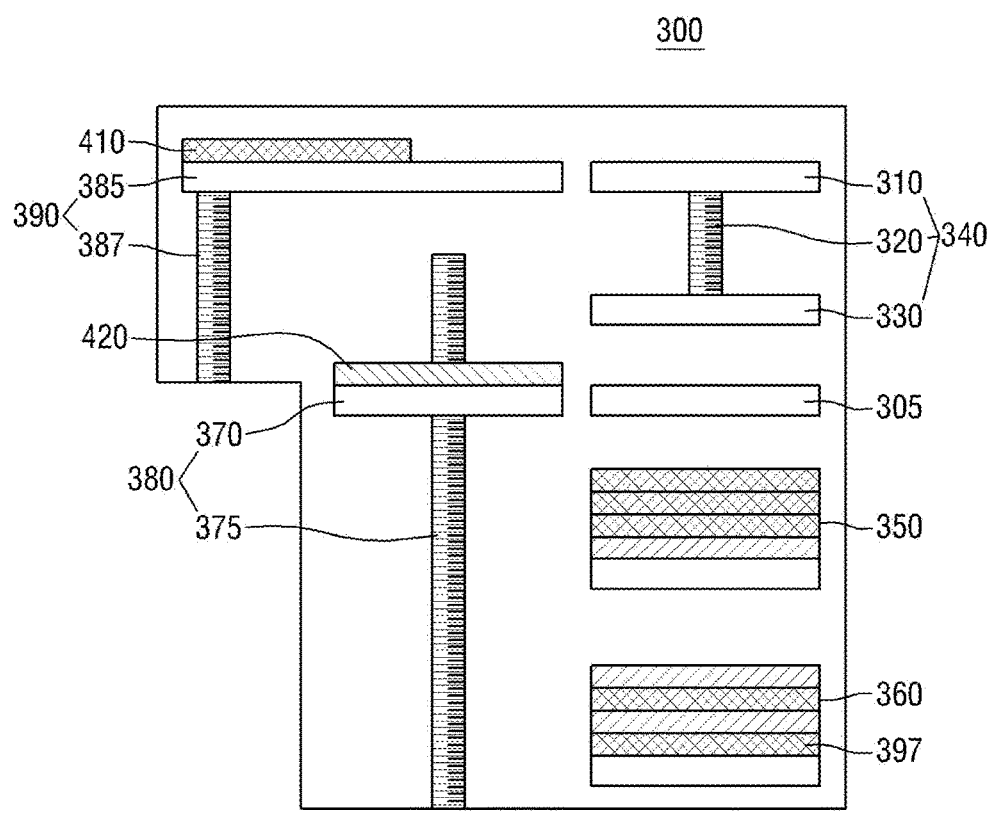
Figure 37:
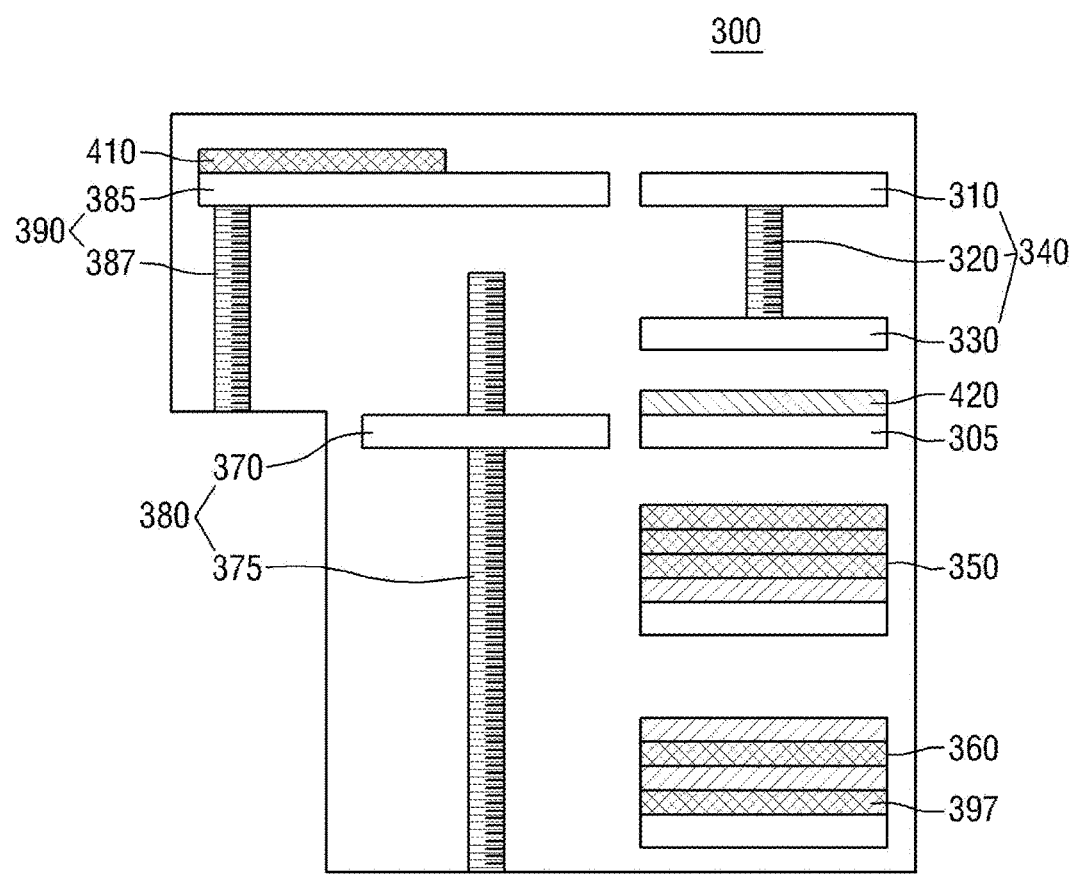

FIG. 4 is a flowchart of a part providing method using a tray feeder according to various embodiments.

Referring to FIG. 4 in reference to FIGS. 1-3, a standby tray stands by in a buffer member (S100). Before a feeding member performs a mounting operation, the standby tray stands by in the buffer member.

A mounted tray in the feeding member is inserted into the buffer member (S200). Before the standby tray is transferred to the feeding member, the mounted tray is transferred from the feeding member to the buffer member.

The standby tray in the buffer member is inserted into the feeding member (S300). After the mounted tray is removed from the feeding member, the standby tray standing by in the buffer member is transferred to the feeding member.

The mounted tray is housed in a magazine using an inserting/extracting member (S400). After the mounted tray having moved from the feeding member to the buffer member is transferred to the inserting/extracting member, and then, transferred to a particular location of a magazine while elevating or lowering the inserting/extracting member. Thereafter, the mounted tray is housed in the magazine using an inserting/extracting device of the inserting/extracting member.

As described above, in the part providing method using a tray feeder according to various exemplary embodiments, on the assumption that a standby tray is standing by in a buffer member, the part mounting operation can be completed by only a three-step cycle. That is to say, a tact time required for performing the part mounting operation can be shortened.

Hereinafter, the part providing method using a tray feeder according to various exemplary embodiments will be described in detail, except for an empty tray refilling process. A refilling member, which is a component of the tray feeder, is not shown in the following figures.

FIGS. 5 to 12 illustrate a part providing method using the tray feeder of FIG. 1, according to an exemplary embodiment.

Referring to FIGS. 5 to 12, the tray 197 of which parts accommodated therein have already been mounted on a board, that is, a mounted tray, is positioned on the feeding member 190, and the standby tray 196 is standing by in the top buffer member 110. The mounted tray 197 positioned in the feeding member 190 is transferred to the bottom buffer member 130, and the buffer member 140 is lowered until the top buffer member 110 and the feeding member 190 are level with each other.

Next, the standby tray 196 standing by in the top buffer member 110 is transferred to the feeding member 190, and the mounted tray 197 in the bottom buffer member 130 is moved to the inserting/extracting member 180. A mounting operation is performed on the standby tray 196 having moved to the feeding member 190 and the inserting/extracting member 180 is lowered at the same time to then move to a place of the mounted tray 197 in the magazine 160, followed by housing the mounted tray 197 in the magazine 160.

Next, the inserting/extracting member 180 extracts a tray 198 on which a mounting operation is to be performed from the magazine 160, and then, is elevated until it is level with the top buffer member 110. Thereafter, the extracted tray 198 is transferred to the top buffer member 110 to then control the standby tray 198 to stand by in the top buffer member 110.

FIGS. 13 to 20 illustrate a part providing method using the tray feeder of FIG. 2, according to another exemplary embodiment.

Referring to FIGS. 13 to 20, the mounted tray 297 is positioned in the feeding member 290, and the standby tray 296 is standing by in the bottom buffer member 230. The mounted tray 297 positioned in the feeding member 290 is transferred to the top buffer member 110, and the buffer member 240 is elevated until the bottom buffer member 230 and the feeding member 290 are level with each other.

Thereafter, the standby tray 296 standing by in the bottom buffer member 230 is transferred to the feeding member 290 to then perform a mounting operation thereon, and the buffer member 240 is lowered until the top buffer member 210 and the inserting/extracting member 280 are level with each other. Then, the mounted tray 297 positioned in the top buffer member 210 is moved to the inserting/extracting member 280, and the inserting/extracting member 280 is lowered to move to a place of the mounted tray 297 in the magazine 250, followed by housing the mounted tray 297 in the magazine 250.

Next, the inserting/extracting member 280 extracts a tray 298 on which a mounting operation is to be performed from the magazine 260, and then, is elevated until it is level with bottom buffer member 230. Thereafter, the extracted tray 298 is transferred to the bottom buffer member 230 to control the extracted 298 to stand by in the bottom buffer member 230.

FIGS. 21 to 28 illustrate a part providing method using the tray feeder of FIG. 3, according to still another exemplary embodiment.

Referring to FIGS. 21 to 28, the mounted tray 397 on which a mounting operation is to be performed is positioned in the feeding member 390, and the standby tray 396 is standing by in the bottom buffer member 330. The mounted tray 397 positioned in the feeding member 390 is transferred to the top buffer member 310, and the feeding member 390 is lowered until the bottom buffer member 330 and the feeding member 390 are level with each other.

Thereafter, the standby tray 396 standing by in the bottom buffer member 330 is transferred to the feeding member 390, which is then elevated, and a mounting operation is performed on the standby tray 396. The top buffer member 310 is lowered to be level with the inserting/extracting member 380, and the mounted tray 397 positioned in the top buffer member 310 is moved to the inserting/extracting member 380. The inserting/extracting member 380 having the mounted tray 397 is lowered to move to a place of the mounted tray 397 in the magazine 360, followed by housing the mounted tray 397 in the magazine 360.

Next, the inserting/extracting member 380 extracts a tray 398 on which a mounting operation is to be performed from the magazine 360, and then, is elevated until it is level with bottom buffer member 330. Thereafter, the extracted tray 398 is transferred to the bottom buffer member 330 to control the extracted tray 398 to stand by in the bottom buffer member 330.

Hereinafter, concurrently performing a mounting operation and refilling an empty tray using a refilling member will be described. The following description will be made with regard to a case of using a tray feeder according to still another exemplary embodiment, and may also be applied to the tray feeder according to the previous exemplary embodiments.

FIGS. 29 to 37 illustrate a refilling method of an empty tray using the tray feeder of FIG. 3, according to still another exemplary embodiment.

Referring to FIGS. 29 to 37, a tray 400 is positioned in the feeding member 390, a mounting operation is performed on the tray 400, and a standby tray 410 is standing by in the bottom buffer member 330. A mounted tray 420 is transferred from the feeding member 390 to the top buffer member 310, and the feeding member 390 is lowered until it is level with the bottom buffer member 330.

Thereafter, the standby tray 410 standing by in the bottom buffer member 330 is transferred to the feeding member 390, which is then elevated, and a mounting operation is performed on the standby tray 410. The top buffer member 310 is lowered to be level with the inserting/extracting member 380, and the mounted tray 420 positioned in the top buffer member 310 is moved to the inserting/extracting member 380. Here, the mounted tray 420 is an empty tray having no further parts accommodated through a number of times of mounting operations (or a single time of a mounting operation).

The inserting/extracting member 380 having the mounted tray 420 is level with the refilling member 305. Thereafter, the empty tray 420 is transferred to the refilling member 305, and the empty tray 420 is refilled with new parts automatically or manually by an operator.

FIGS. 38 and 40 are perspective views of a tray feeder 400 according to exemplary embodiments and FIG. 39 is a side view of the tray feeder 400 according to exemplary embodiments. As described in FIGS. 38 to 40, in the tray feeder 400 according to the exemplary embodiments, operating efficiency can be enhanced while efficiently using an operating field space. The tray feeder 400 may include all the elements of the tray feeders 100, 200 and 300 of FIGS. 1 to 3, respectively. In FIGS. 38 to 40, the reference numeral 470 indicates an inserting/extracting member corresponding to the inserting/extracting members 170, 270 and 370 illustrated in FIGS. 1 to 3, respectively. The reference numeral 475 indicates an elevating device corresponding to the elevating devices 175, 275 and 375 illustrated in FIGS. 1 to 3, respectively. The reference numeral 490 is an opening through which new parts are refilled in a tray accommodated in the tray feeder 400.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims. It is therefore desired that the exemplary embodiments be considered in all respects as illustrative and not restrictive, reference being made to the appended claims rather than the foregoing description to indicate the scope of the inventive concept.

What is claimed is:

1. A tray feeder comprising:
   a magazine which houses at least one tray for accommodating parts;
   an inserting/extracting member which inserts a tray into the magazine or extracts one of the at least one tray from the magazine;
   a buffer member which is positioned above the magazine, and includes a top buffer member and a bottom buffer member positioned under the top buffer member, wherein the top buffer member supports a standby tray from which parts accommodated therein are to be mounted on a board by a part mounting device, wherein the standby tray is housed in the magazine, and is extracted and inserted into the top buffer member by the inserting/extracting member; and
   a feeding member which is positioned above the inserting/extracting member, extracts the standby tray from the buffer member, and supports the standby tray while the parts accommodated in the standby tray are adhered by the part mounting device,
   wherein the feeding member inserts a mounted tray of which parts have been mounted on the board by the part mounting device into the bottom buffer member,
   wherein the inserting/extracting member is elevated or lowered to insert a tray into the magazine or extract one of the at least one tray from the magazine,
   wherein the standby tray is temporarily positioned on the top buffer member, and the mounted tray is temporarily positioned on the bottom buffer member.

2. The tray feeder of claim 1, further comprising a refilling member which temporarily supports an empty tray so as to refill the empty tray with parts,
   wherein the refilling member is positioned between the buffer member and the magazine.

3. The tray feeder of claim 1, wherein the inserting/extracting member includes at least one inserting/extracting plate which supports a tray and an elevating device which elevates or lowers the at least one inserting/extracting plate.

4. The tray feeder of claim 1,
   wherein the top buffer member is elevated or lowered.

5. The tray feeder of claim 1, wherein the inserting/extracting member extracts the mounted tray from the bottom buffer member to insert the extracted tray into the magazine.

6. The tray feeder of claim 1, wherein the top buffer member or the lower buffer member is elevated or lowered to be level with the inserting/extracting member or the feeding member.

7. The tray feeder of claim 4, wherein the top buffer member is a place where the mounted tray is temporarily positioned, and the bottom buffer member is a place where the standby tray is temporarily positioned,
   wherein the feeding member extracts the standby tray from the bottom buffer member and inserts the extracted tray into the top buffer member.

8. The tray feeder of claim 7, wherein the inserting/extracting member extracts the standby tray, which is housed in the magazine, to insert the extracted standby tray into the bottom buffer member, and extracts the mounted tray from the top buffer member to insert the extracted tray into the magazine.

9. The tray feeder of claim 4, wherein the top buffer member is a place where the mounted tray is temporarily positioned, and the bottom buffer member is a place where the standby tray is temporarily positioned,
   wherein the feeding member is elevated or lowered, and after being elevated, the feeding member inserts the mounted tray into the top buffer member, and after being lowered, the feeding member extracts the standby tray from the bottom buffer member.

* * * * *